US012607674B2

(12) United States Patent
Hanna

(10) Patent No.: US 12,607,674 B2
(45) Date of Patent: Apr. 21, 2026

(54) SWITCHGEAR GROUND AND TEST DEVICE HAVING GROUND SHOE ASSEMBLY WITH CONDUCTIVE CLAMP ASSEMBLY AND ASSOCIATED METHODS

(71) Applicant: JST POWER EQUIPMENT, INC., Lake Mary, FL (US)

(72) Inventor: Robert L. Hanna, Enterprise, FL (US)

(73) Assignee: JST POWER EQUIPMENT, INC., Lake Mary, FL (US)

( * ) Notice: Subject to any disclaimer, the term of this patent is extended or adjusted under 35 U.S.C. 154(b) by 162 days.

(21) Appl. No.: 18/610,322

(22) Filed: Mar. 20, 2024

(65) Prior Publication Data

US 2025/0298081 A1 Sep. 25, 2025

(51) Int. Cl.
*G01R 31/327* (2006.01)

(52) U.S. Cl.
CPC .................................. *G01R 31/327* (2013.01)

(58) Field of Classification Search
CPC .... G01R 31/327; G01R 31/3272; G01R 1/04; G01R 1/0408; H02B 1/16
See application file for complete search history.

(56) References Cited

U.S. PATENT DOCUMENTS

| | | |
|---|---|---|
| 10,050,420 B1 | 8/2018 | Yonce et al. |
| 11,735,893 B2 | 8/2023 | Hanna et al. |
| 11,762,020 B2 | 9/2023 | Hanna et al. |
| 2015/0332883 A1 | 11/2015 | Benke |
| 2016/0241003 A1 | 8/2016 | Frye et al. |
| 2019/0072602 A1* | 3/2019 | Ashtekar ................ H02B 11/28 |
| 2023/0258723 A1* | 8/2023 | Hanna ................ G01R 31/3272 |
| | | 324/424 |

OTHER PUBLICATIONS

GE Industrial Solutions, "SecoVac Ground & Test Device," DEH-50007 Installation, Operation and Maintenance Manual; Retrieved from the Internet: https://library.e.abb.com/public/41a6ca296b02427d952d4ce026f581f0/DEH-50007%20GE_SecoVac-Ground-and-Test-Device-Manual.pdf; Jul. 28, 2021; pp. 1-20.

* cited by examiner

*Primary Examiner* — Son T Le
(74) *Attorney, Agent, or Firm* — ALLEN, DYER, DOPPELT + GILCHRIST, P.A.

(57) ABSTRACT

A ground and test (G&T) device includes a test device housing configured to be installed within a compartment of a switchgear frame into a testing position. A ground shoe assembly engages a grounding circuit having a grounding bar carried by the switchgear frame. The ground shoe assembly includes a conductive clamp assembly that slides on the grounding bar as the test device housing is moved into the testing position. The conductive clamp assembly clamps onto the grounding bar in secure electrical contact when the test device housing is in the testing position.

28 Claims, 19 Drawing Sheets

TO GROUNDING CIRCUIT 74

SWITCHGEAR GROUND AND TEST DEVICE HAVING GROUND SHOE ASSEMBLY WITH CONDUCTIVE CLAMP ASSEMBLY AND ASSOCIATED METHODS

FIELD OF THE INVENTION

The present invention relates to the field of electronic systems, and more particularly, this invention relates to electrical contact assemblies having conductive clamp assemblies, such as used with ground and test (G&T) devices for switchgear systems and related methods.

BACKGROUND OF THE INVENTION

Metal-clad or metal-enclosed medium voltage switchgear systems operate as three-phase systems that connect to the three-phase power distribution grid and provide various control functions and provide protection against short circuit events and similar overcurrent or other fault conditions. They often include circuit breakers, which open and close individual circuits and are mounted on a truck that is movable within a compartment of a switchgear frame. Circuit breakers may include vacuum interrupters, with a respective vacuum interrupter forming a single-phase circuit breaker for one of the three-phases.

The vacuum interrupters are removable from the switchgear frame by disengaging the circuit breaker from the load and line conductors and racking out the truck carrying the vacuum interrupters from the switchgear compartment. The metal-clad switchgear is compartmentalized and uses grounded metal components for many parts of the circuit to help minimize fault propagation and to make repairs easier and safer. An electrical bus may be insulated to minimize a potential flash over or fault between phases of circuits within the switchgear system.

During maintenance, the conventional and standard electrical safety practices require the insertion of a temporary grounding device within the switchgear compartment to protect the electrician from accidental energization of power equipment in the system and permit grounding of any high voltages that may remain on a line. It is necessary to ground the high voltage electric lines to protect personnel working on these lines and protect circuit components. It is also desirable to be able to test phase out, voltages, and selectively ground either the bus or line circuits during maintenance and testing.

There are numerous designs for ground and test devices used in switchgear systems. These designs include: 1) simple manual; 2) complex manual; 3) simple electrical; and 4) complex electrical. A simple manual ground and test device usually includes upper and lower terminals that connect load and line conductors to a ground circuit. Also, some grounding mechanisms employed in these ground and test devices do not provide an adequate ground connection when in use. For that reason, some grounding mechanisms use traditional sliding contacts where a pushing force is constantly exerted to install the ground and test device within the switchgear frame, but a large lateral spring force is exerted against the sliding contacts. This creates constant friction on the sliding contacts during installation, often causing wear on the silver or other coated surfaces. Improved electrical contact assemblies, such as for ground and test devices are desired.

SUMMARY OF THE INVENTION

A ground and test (G&T) device may comprise a test device housing configured to be installed within a compartment of a switchgear frame into a testing position. A ground shoe assembly may be carried by the test device housing configured to engage a grounding circuit having a grounding bar carried by the switchgear frame. The ground shoe assembly may comprise a conductive clamp assembly configured to slide on the grounding bar as the test device housing is moved into the testing position. The conductive clamp assembly may be configured to clamp onto the grounding bar in secure electrical contact when the test device housing is in the testing position.

The conductive clamp assembly may comprise opposing electrical contacts spaced apart a distance to receive therebetween the grounding bar and slide thereon as the test device housing moves into the testing position. Each electrical contact may comprise a bus bar. Each electrical contact may include a spring assembly connected thereto. A pivot arm may engage the spring assembly and configured to pivot onto the spring assembly to bias the respective spring assembly against the respective electrical contact when the test device housing is in the testing position. Each pivot arm may include a roller. The ground shoe assembly may comprise a support plate having inclined surfaces on which the respective rollers move to pivot the respective pivot arm against the respective spring assembly. The conductive clamp assembly may include fasteners. The support plate may include slots that receive the fasteners. The fasteners and slots may be configured to allow movement of the support plate and the spring assemblies and pivot arms relative to each other.

In an example, the ground shoe assembly may comprise a grounding bar stop configured to engage the grounding bar when the test device housing is installed into the testing position and prevent further movement of the spring assemblies as the roller of each pivot arm is biased against the inclined surface of the respective support plate and pivots onto the respective spring assembly to bias the opposing electrical contacts against each other for secure electrical contact. Each pivot arm may include a roller assembly engaging each respective spring assembly. The ground shoe assembly may include a roller ramp on which each roller assembly moves and configured to push each roller assembly against the respective pivot arm and spring assembly and bias the spring assembly against the respective electrical contacts when the test device housing is in the testing position. The ground shoe assembly may comprise a grounding bar stop configured to engage the grounding bar when the test device housing is installed into the testing position.

A method of operating a ground and test (G&T) device may comprise installing a test device housing within a compartment of a switchgear frame into a testing position. The method further includes engaging a grounding circuit having a grounding bar carried by the switchgear frame with a ground shoe assembly carried by the test device housing. The ground shoe assembly may comprise a conductive clamp assembly configured to slide on the grounding bar as the test device housing is moved into the testing position. The conductive clamp assembly may be configured to clamp onto the grounding bar in secure electrical contact when the test device housing is in the testing position.

BRIEF DESCRIPTION OF THE DRAWINGS

Other objects, features and advantages of the present invention will become apparent from the Detailed Description of the invention which follows, when considered in light of the accompanying drawings in which.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
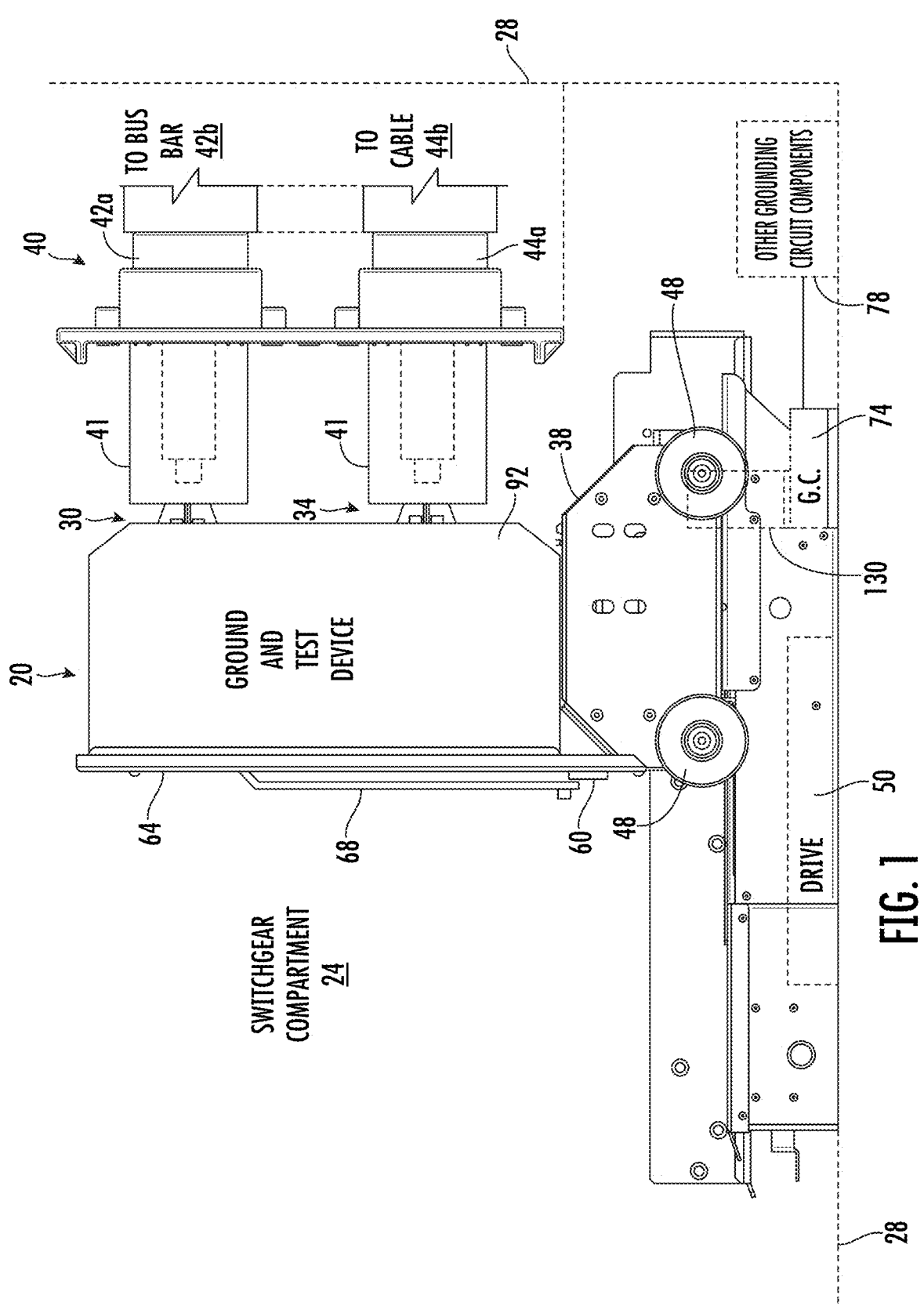
FIG. 1 is a side elevation view of the ground and test device showing upper and lower terminals connected to the load and line conductors in accordance with a non-limiting example.
Figure 2:
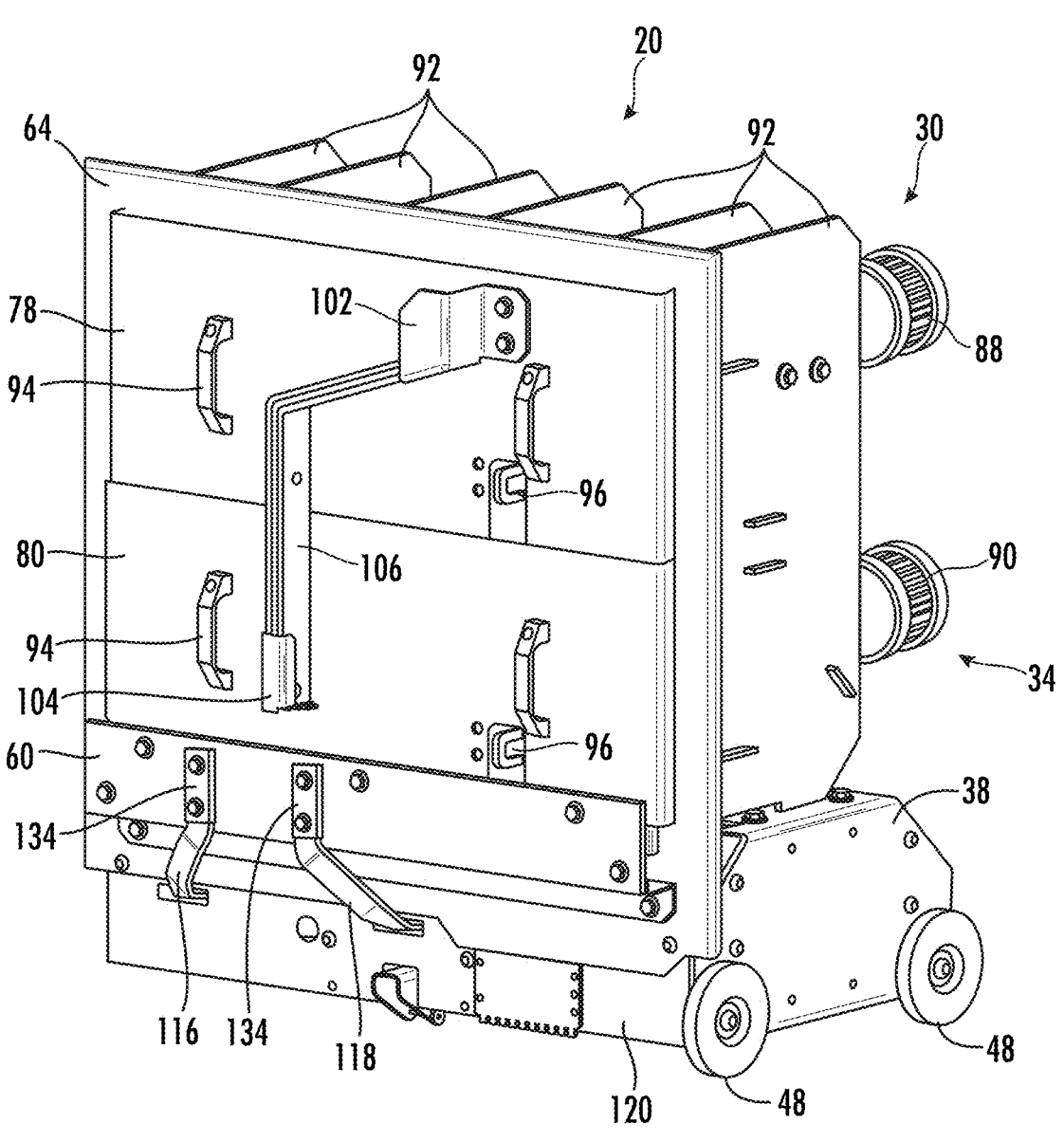
FIG. 2 is a front isometric view of the ground and test device of FIG. 1.

Referring now to FIG. 1, there is illustrated the ground and test (G&T) device 20 that is removably installed within a switchgear compartment 24 of a switchgear frame shown by the dashed line at 28. The G&T device 20 includes an electrical contact assembly having a conductive clamp assembly as part of the ground shoe assembly as explained in detail later below. The G&T device 20 includes a plurality of upper terminals 30 and a plurality of lower terminals 34 carried by a test device housing 38 that are configured to engage respective three-phase load and line conductors 40 in the switchgear compartment 24 of the switchgear frame 28 when the test device housing 38 is installed in the switchgear compartment 24 of the switchgear frame 28.

The test device housing 38 may be configured similar to a conventional truck carrying conventional vacuum interrupters and insertable within the switchgear component 24, thus allowing the test device housing to be racked in and racked out, whether via a drive mechanism or manually. The test device housing 38 includes in this example three upper terminals 30 and three lower terminals 34 that are configured to engage the respective three-phase load and line conductors 40. For example, as shown in FIG. 1, the individual line conductors 42a may connect to a bus bar 42b and individual load conductors 44a may connect to a cable 44b. The upper terminals 30 may engage the line conductors 42a and connect to the bus bar 42b, which connects to outside high voltage sources, while the lower terminals 34 may connect to the load conductors 44a, and in turn, may connect to the cable 44b that connects to an apartment building or other load as a non-limiting example.

The test device housing 38 includes wheels 48 that allow the test device housing to be inserted within the switchgear compartment 24 of the switchgear frame 28. The wheels may roll on side rails (not shown) within the switchgear compartment 24 of the switchgear frame 28 and allow full insertion of the test device housing 38 such that the upper and lower terminals 30,34 engage the respective load and line conductors 40.

Although not illustrated in detail, the switchgear frame 28 supports a drive mechanism illustrated schematically by the dashed lines at 50 for each truck carrying a vacuum interrupter, and in turn, may be used to rack in and rack out a test device housing 38. Those skilled in the art should understand that the test device housing 38 may be racked in and racked out manually, such as by use of a hand crank or other mechanism, or racked in and racked out automatically via a drive mechanism 50. The test device housing 38 may have a width, height and depth that are similar in dimensions and configuration to a conventional truck carrying vacuum interrupters so that the test device housing may be received within the switchgear compartment 24 of the switchgear frame 28 with little difficulty.

Referring now more particularly to FIGS. 2-6, a lower ground bus bar 60 is carried by the test device housing 38 and formed in this example as a rectangular piece of bus that extends over the lower section of a front panel 64. A plurality of grounding bars 68 selectively connect either the upper terminals 30 to the lower ground bus bar 60 or connect the lower terminals 34 to the lower ground bus bar 60. A ground shoe assembly 70 is carried on the underside of the ground and test device 20 (FIG. 6) and connected to the lower ground bus bar 60 and configured to engage a grounding circuit 74 (G. C.) carried by the switchgear frame 28. The grounding circuit 74 may connect to various switchgear and other grounding components 78 to aid in grounding the switchgear frame 28 during maintenance and protect workers downstream from the switchgear frame, such as those working on downstream line components, e.g., a transformer or breaker. The ground shoe assembly includes conductive clamp assembly (CCA) shown schematically by the block indicated generally at 200 (FIG. 6) and explained in detail below.

In this example, the ground and test device 20 includes three upper terminals 30 and three lower terminals 34 configured to engage the respective three-phase load and line conductors 40. Each grounding bar 68 (FIGS. 4 and 5) includes an upper flat end 68a that is configured to engage either an upper terminal 30 or lower terminal 34, and an outwardly angled section 68b that extends outward from the test device housing 38, and a vertically extending lower flat section 68c that is configured at its lower end to engage the lower ground bus bar 60.

Figure 3:
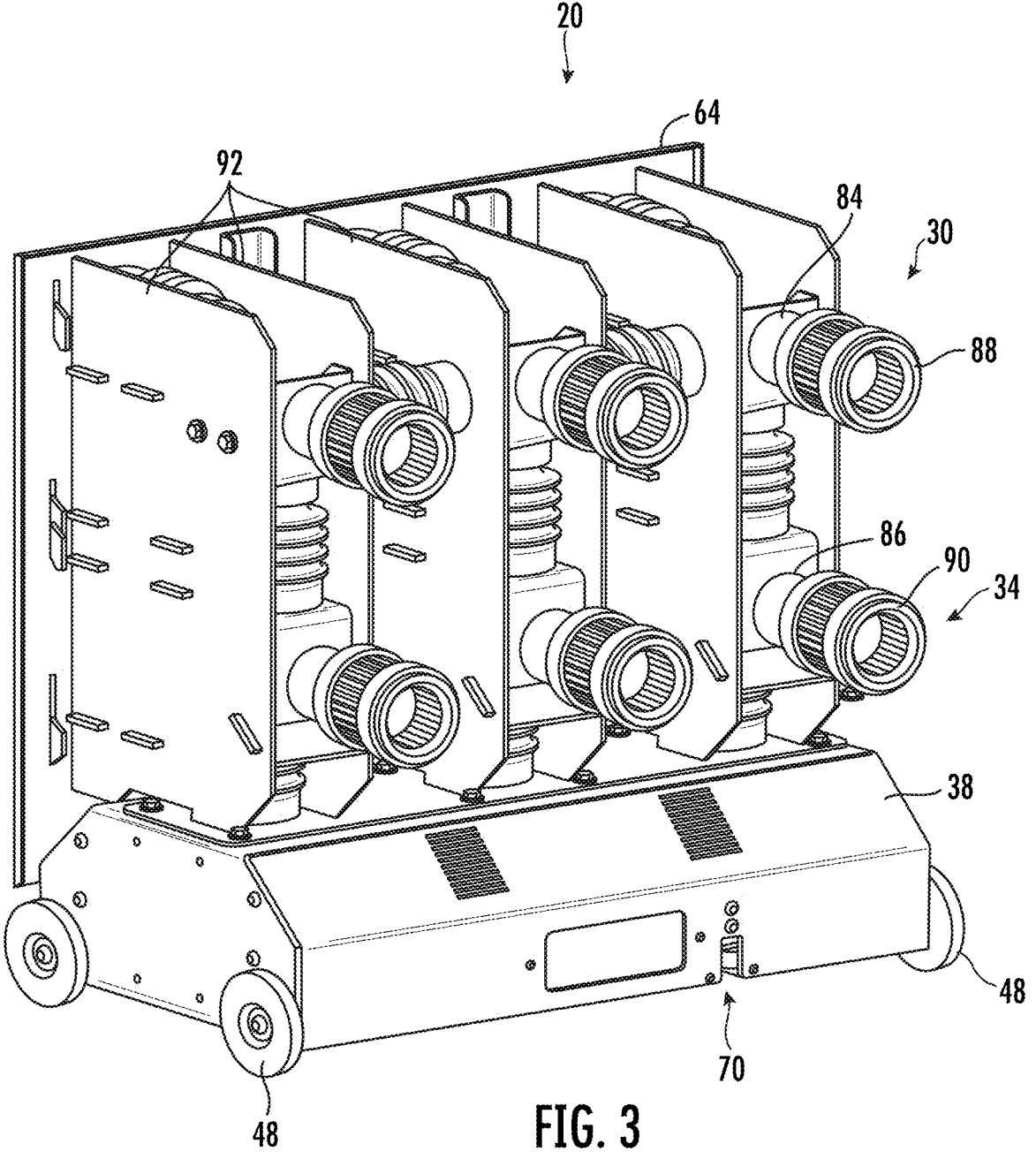
FIG. 3 is a rear isometric view of the ground and test device of FIG. 1 showing the upper and lower contact arms each carrying arm and cluster assemblies.

The test device housing 38 includes its front panel 64 (FIG. 2) that may have a removable upper door 78 and removable lower door 80 to expose the respective upper and lower terminals 30,34 onto which the grounding bars 68 are secured. Upper terminals 30 are exposed when the upper doors 78 are removed and the lower terminals 34 are exposed when the lower doors 80 are removed. On the side opposite from which the grounding bars 68 connect, the upper and lower terminals 30,34 each include respective upper and lower contact arms 84, 86, which each carry respective upper and lower cluster assemblies 88, 90 that engage the respective load and line conductors 40 (FIG. 3).

The ground and test device 20 includes ground and test barrier panels 92 (FIGS. 2 and 3) that separate the different upper and lower contact arms 84, 86 and the respective upper and lower cluster assemblies 88,90 that engage the respective load and line conductors 40. In this example, six vertical barrier panels 92 are employed (FIG. 3). As illustrated, the test device housing 38 and upper and lower cluster assemblies 88,90 and upper and lower contact arms 84, 86 are similarly configured and dimensioned as a conventional truck carrying vacuum interrupters. An example ground and test device configured similar to a conventional truck is disclosed in U.S. Pat. No. 11,735,893, the disclosure which is hereby incorporated by reference in its entirety. When the ground and test device is inserted, the cluster assemblies 88,90 engage in a proper fit to the load and line conductors, which include receptacles 41 that receive the cluster assemblies (FIG. 1).

The test device housing 38 includes its front panel 64 having its removable upper and lower doors 78,80, which each include pull handles 94 and a ground and test lock mechanism 96 to allow a padlock or locking mechanism to be inserted within the lock mechanism and prevent the locked doors 78,80 from being removed. The front panel 64 also includes a ground and test upper bus bracket 102 and lower bus bracket 104 and a ground and test grounding bus 106 connected between the two bus brackets.

Figure 4:
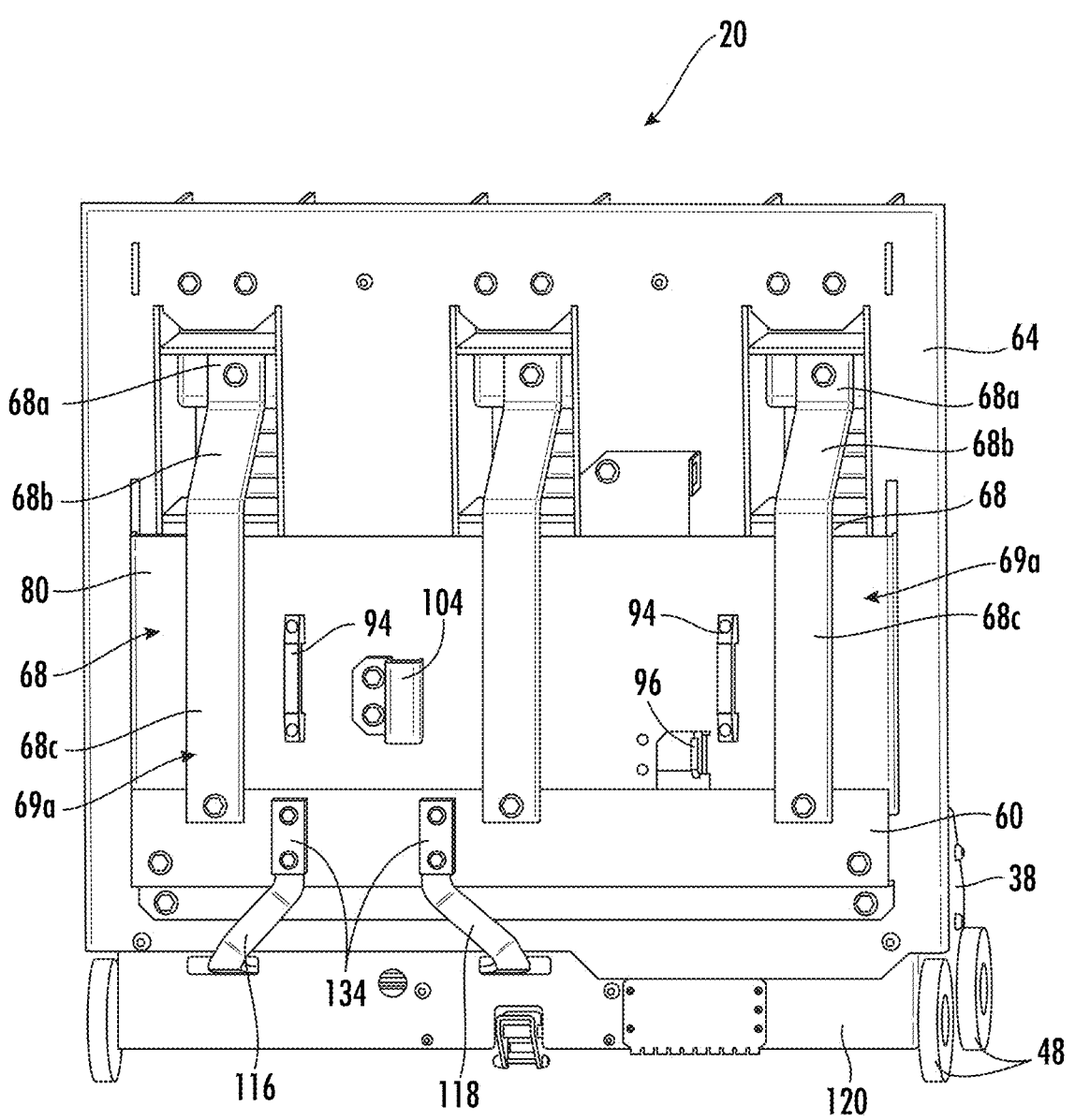
FIG. 4 is another front isometric view of the ground and test device showing the upper door removed and a first set of grounding bars that connect the upper terminals to the lower ground bus bar.
Figure 5:
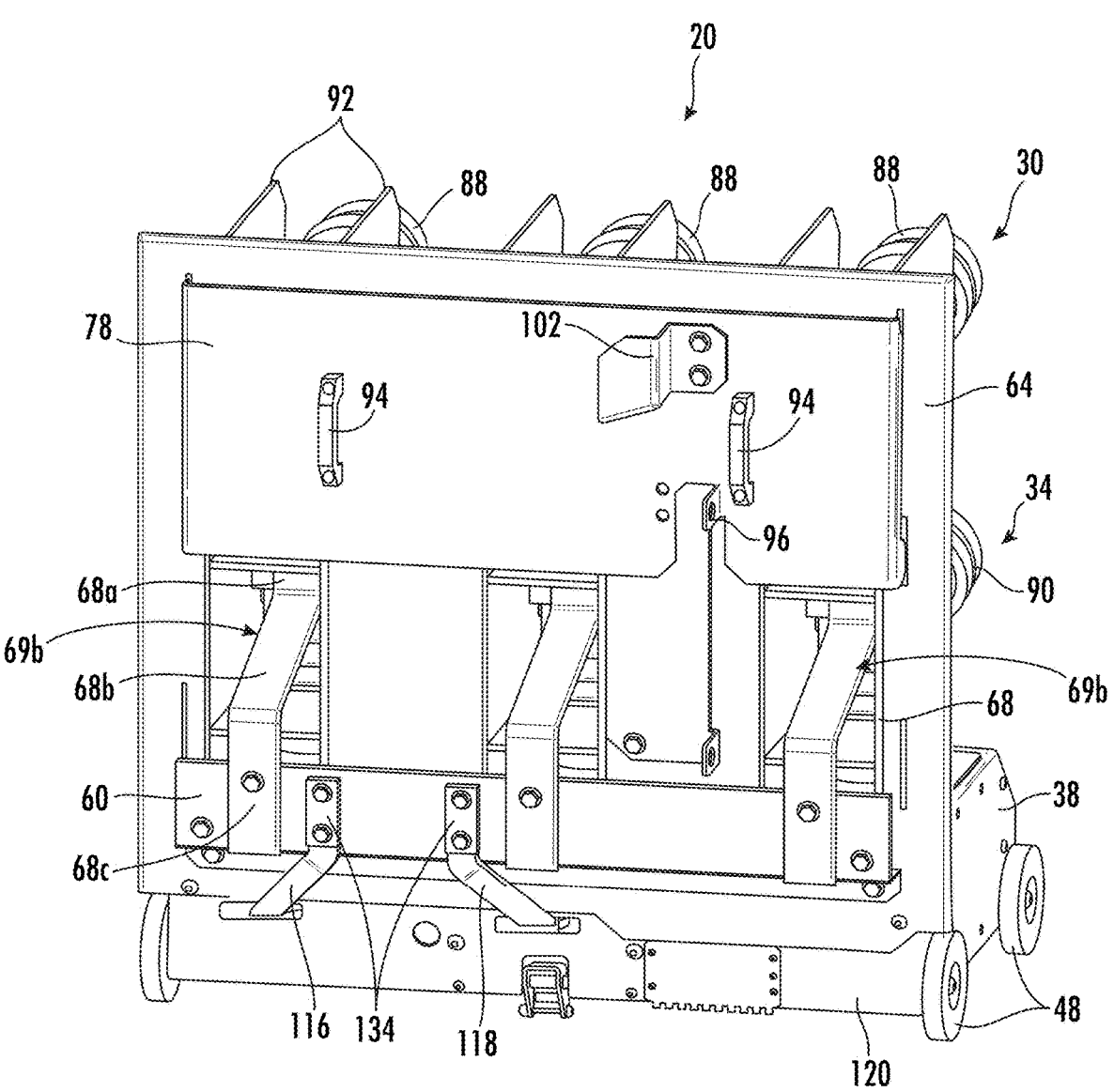
FIG. 5 is another front isometric view similar to FIG. 4, but showing the lower door removed and a second set of grounding bars that connect the lower terminals to the lower ground bus bar.

Each grounding bar 68 of first and second sets of grounding bars may be formed as a single piece of metallic bus that is shaped in the configuration as shown in FIGS. 4 and 5 to include the upper flat end 68a, the outwardly angled section 68b, and the vertically extending lower flat section 68c. Grounding bars 68 may vary in dimension, e.g., their length, width, and thickness, but in an example may range anywhere from ⅛ inch thick to ⅜ inch thick as found with bus metal used in switchgear systems and be about 1 inch to 3 inches in width.

Referring now to FIGS. 4 and 5, there are illustrated details of the ground and test device 20 that includes first and second sets 69a, 69b of grounding bars 68. The device 20 includes a plurality of grounding bars 68 that selectively connect either the upper terminals 30 to the lower ground bus bar 60 or connect the lower terminals 34 to the lower ground bus bar 60. The plurality of grounding bars 68 includes a first set 69a of grounding bars that connect the upper terminals 30 to the lower ground bus bar 60 and a second set 69b of grounding bars that connect the lower terminals 34 to the lower ground bus bar when the first set of grounding bars are not connected. The ground shoe assembly 70 with an electrical contact assembly includes a conductive clamp assembly 200 as part of the ground shoe assembly and is explained in detail below.

In an example, the first set 69a of grounding bars 68 are similarly configured to the second set 69b of grounding bars except the second set of grounding bars have a shorter, vertically extending lower flat section 68c. This configuration shown in FIGS. 4 and 5 provides a technical benefit since the current does not get necked down in the area by a central fastener opening and begin overheating in that area. With the configuration in FIGS. 4 and 5, a larger lower ground bus bar 60 is not required.

The ground and test device 20 in FIGS. 4 and 5 includes the test device housing 38 configured to be removably installed within a compartment of a switchgear frame having respective load and line conductors. A plurality of upper terminals 30 and plurality of lower terminals 34 are carried by the test device housing 38 and configured to engage the respective load and line conductors when the test device housing is installed within a compartment of the switchgear frame. A lower ground bus bar 60 is carried by the test device housing 38.

As noted before, the plurality of grounding bars 68 selectively connect either the upper terminals 30 to the lower ground bus bar 60 or connect the lower terminals 34 to the lower ground bus bar 60. This plurality of grounding bars 68 includes the first set 69a of grounding bars that connect the upper terminals 30 to the lower ground bus bar 60 and the second set 69b of grounding bars that connect the lower terminals 34 to the lower ground bus bar when the first set of grounding bars are not connected.

Each grounding bar 68 in first and second sets 69a, 69b includes an upper flat end 68a that is configured to engage the respective upper or lower terminal 30,34, and outwardly angled section 68b that extends outward from the test device housing 38 and vertically extending lower flat section 68c that is configured to engage the lower ground bus bar 60. The test device housing 38 includes a front panel 64 having removable upper and lower doors 78,80 to expose upper and lower terminals 30,34, which the grounding bars are secured. The upper and lower terminals 30,34 each include upper and lower contact arms, each carrying cluster assemblies 88, 90 that engage load and line conductors. Other components are illustrated in FIGS. 4 and 5, including the pull handle 94, upper bus bracket 102, lower bus bracket 104, lock mechanism 96, contact connectors 134, first and second flexible cables 116, 118, blocking plate 120, wheels 48, and front panel 64.

Figure 7:
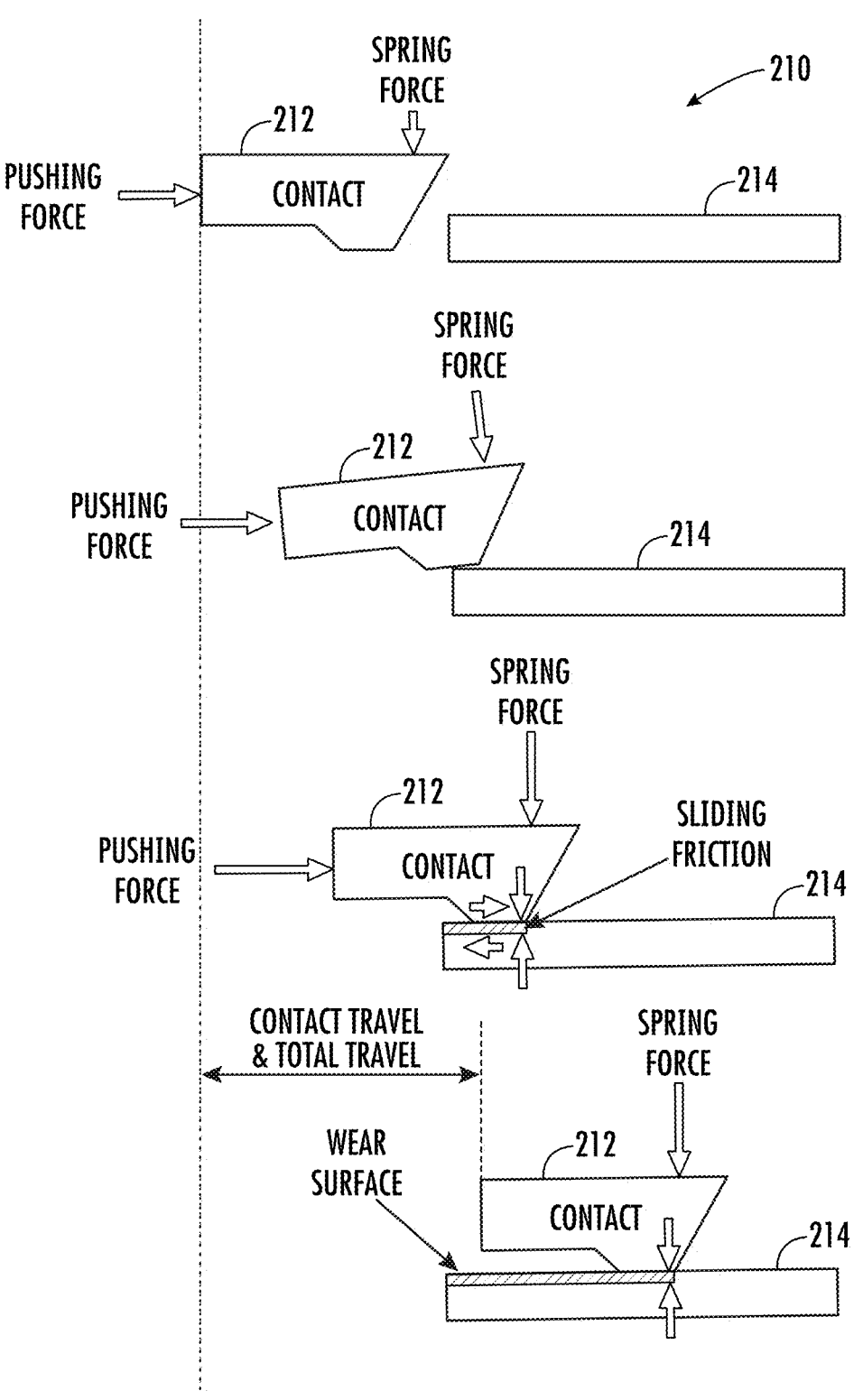
FIG. 7 is a schematic diagram showing the function of a prior art sliding electrical contact assembly.

Referring now to FIG. 7, there is illustrated a schematic diagram showing the function of a traditional sliding electrical contact assembly 20 that is sometimes used in prior art switchgear ground and test devices and other electrical contact assemblies. In this prior art electrical contact assembly 210, a pushing force is constantly exerted to install the ground and test device within the switchgear frame, but a large lateral spring force is exerted against the sliding contacts 212,214. This lateral spring force creates constant friction on the sliding contacts 212, 214 during installation, often causing wear on the silver or other coated surfaces.

Figure 8:
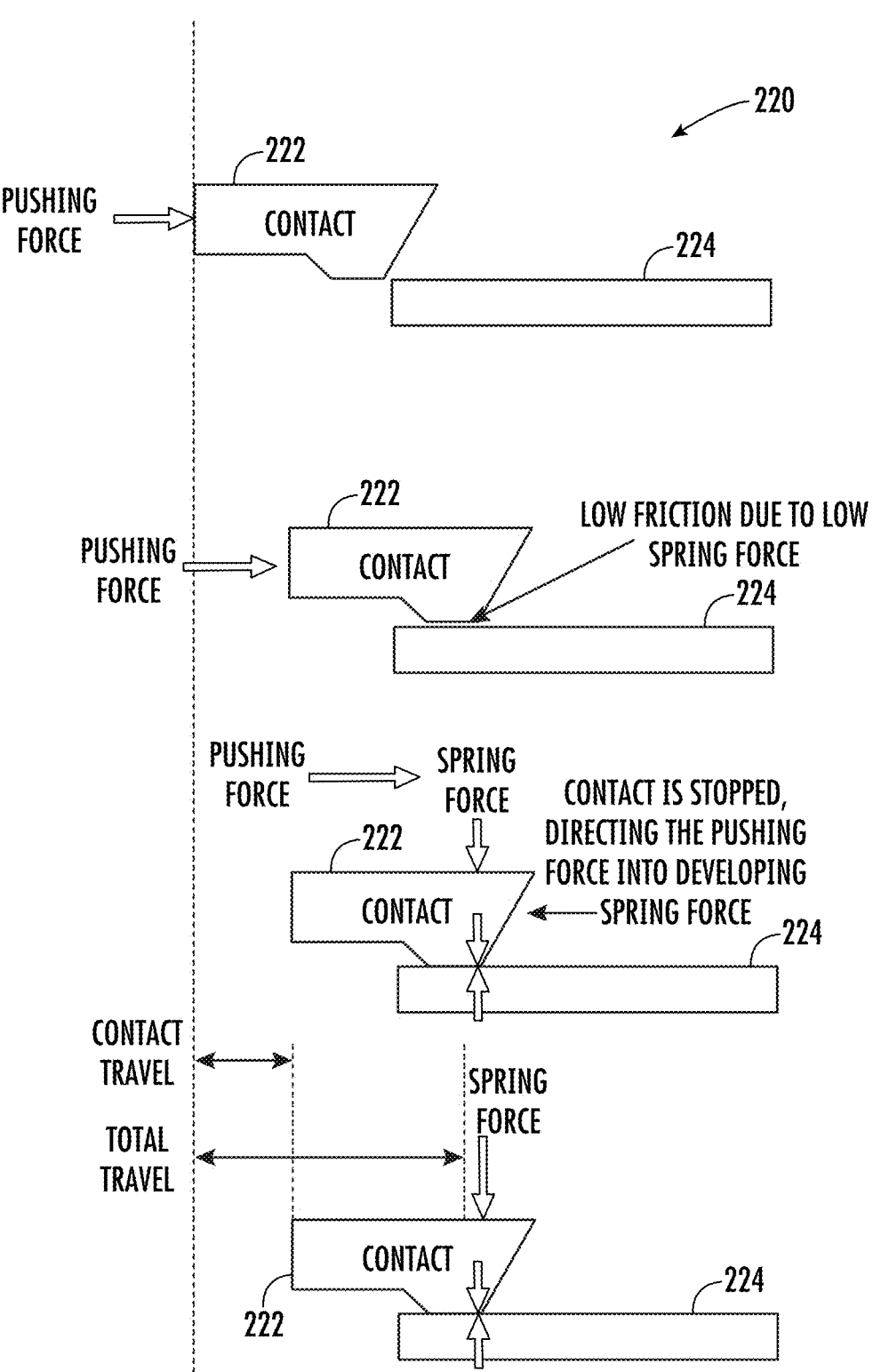
FIG. 8 is a schematic diagram showing the function of the sliding electrical contact assembly of the current invention.

The sliding electronic contact assembly 220 of the current invention, however, as shown in FIG. 8, applies a pushing force against a first contact 222, such as part of a ground and test device. The ground shoe assembly carried by the ground and test device supports the contact 222 that is pushed via the ground and test device. When initial contact is made by the contact 222 with another contact 224, such as a grounding bar. There is low friction due to a low lateral spring force against the contact 222. As the pushing force is further applied and the contact 222 is pushed forward, the contact is stopped, directing the pushing force into a developing lateral spring force. For example, in the case of a ground and test device, this could be electrical contacts that are formed by bus bars that engage another grounding bar as a bus bar. As the spring force is developed, the force is exerted against the contacts 222,224 to clamp onto the grounding bar and secure the electrical contacts in a secure, electrical connection in the example when the test device housing is in a testing position.

Referring now to FIGS. 9-13, there is illustrated a first embodiment of a conductive clamp assembly 200 that is part of a ground shoe assembly 70 carried by a test device housing 38 of the ground and test device 20. The test device housing 38 is configured to be installed within a compartment of the switchgear frame 28 into a testing position (FIG. 1). The ground shoe assembly 70 is carried by the test device housing 38 and configured to engage the grounding circuit 74 having a grounding bar 230 carried by the switchgear frame 28 (FIG. 6), showing the underside of the ground and test device 20 with the conductive clamp assembly 200 shown by the block diagram. In this example, the switchgear frame with its grounding bar 230 may correspond to a frame having an electrically conductive frame contact and the conductive clamp assembly engages the electrically conductive frame contact with the combination forming an electrical contact assembly.

In this example, the conductive clamp assembly 200 is configured to slide on the grounding bar 230 as the test device housing 38 is moved into the testing position. The conductive clamp assembly 200 is configured to clamp onto the grounding bar 230 in secure electrical contact when the test device housing 38 is in the testing position. The first and second flexible cables 116,118 connect to the conductive clamp assembly 200, and as explained below with reference to FIGS. 9-13, are connected to opposing first and second electrical contacts 242, 244 that are spaced a distance from each other to receive therebetween the grounding bar 230 and slide thereon as the test device housing 38 moves into the testing position.

Figure 6:
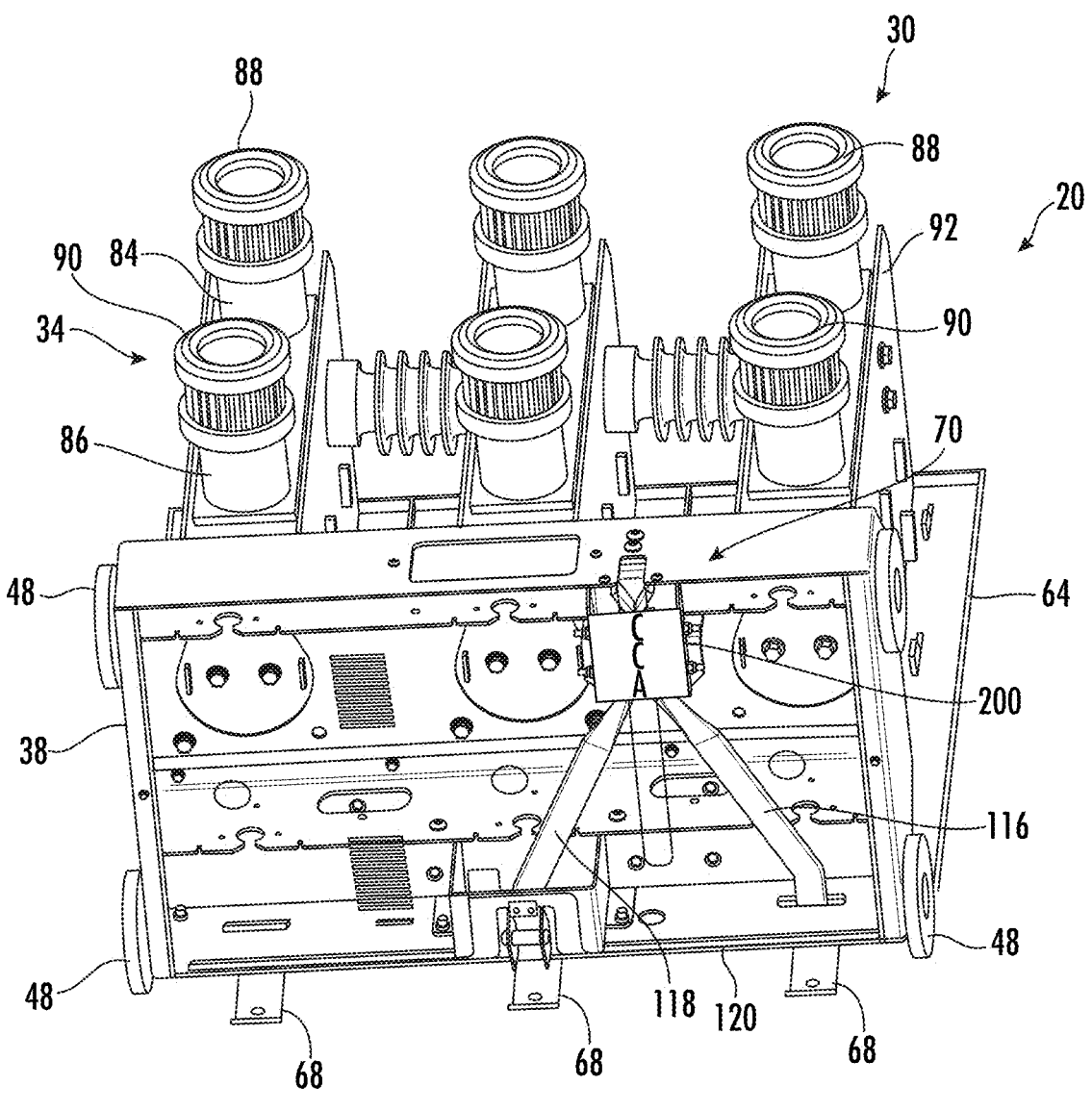
FIG. 6 is a bottom isometric view of the ground and test device showing the ground shoe assembly with the conductive clamp assembly shown generally by the block labeled CCA.
Figure 9:
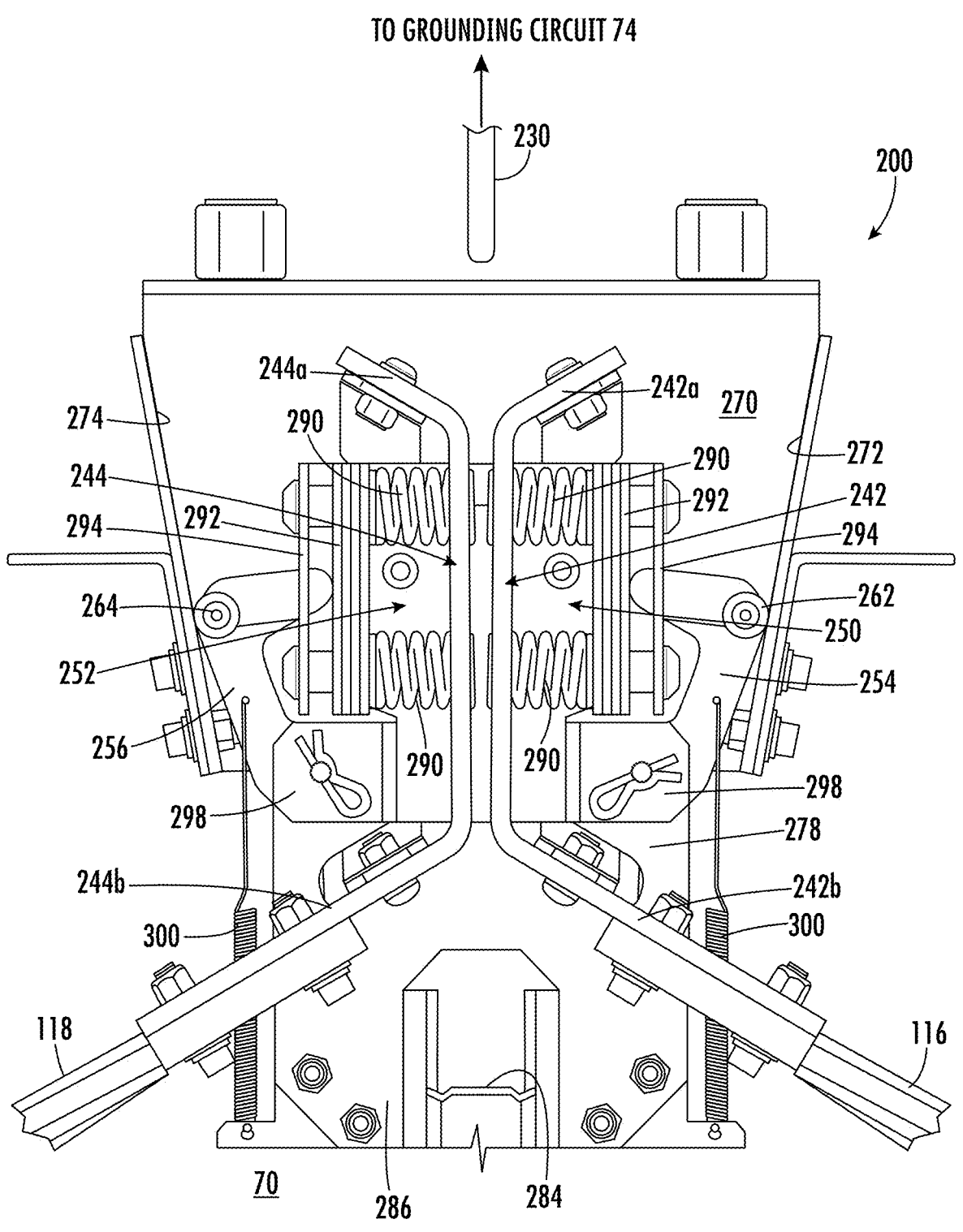
FIG. 9 is a plan view of a first embodiment of the conductive clamp assembly of the current invention.

In the current example, each electrical contact 242,244 of the conductive clamp assembly 200 is formed as a bus bar as shown in FIG. 9, indicating first and second bus bars. The opposing bus bars 242, 244 each have first ends 242a, 244a and second ends 242b, 244b. The first ends 242a, 244a engage the grounding circuit 74. The first and second flexible cables 116, 118 interconnect each of the second ends 242b, 244b of the first and second bus bars 242, 244 to the lower ground bus bar 60 as shown in FIG. 6. The first and second flexible cables 116,118 extend through a blocking plate 120 positioned at the lower section of the front panel 64 and extend upward to connect onto the lower ground bus bar 60.

In an example, the first and second flexible cables 116,118 are formed as braided cable that connect at their end to an outward angled section defining the second ends 242b, 244b of first and second opposing bus bars 242, 244. The first ends 242a, 244a of each of the first and second opposing bus bars 242,244 include flared ends that extend outward. The grounding circuit 74 includes the vertical grounding bar 230. The flared ends 242a, 244a expand outward and separate slightly the first and second opposing bus bars 242,244 of the conductive clamp assembly 200 as initial contact is made. However, the conductive clamp assembly 200 slides on the grounding bar 230 as the test device housing 38 is moved into the testing position. The conductive clamp assembly 200 clamps onto the grounding bar 230 in secure electrical contact when the test device housing 38 is in the testing position and functions similar to the electrical contact assembly 220 having automatic clamping as shown in FIG. 8.

Figure 11:
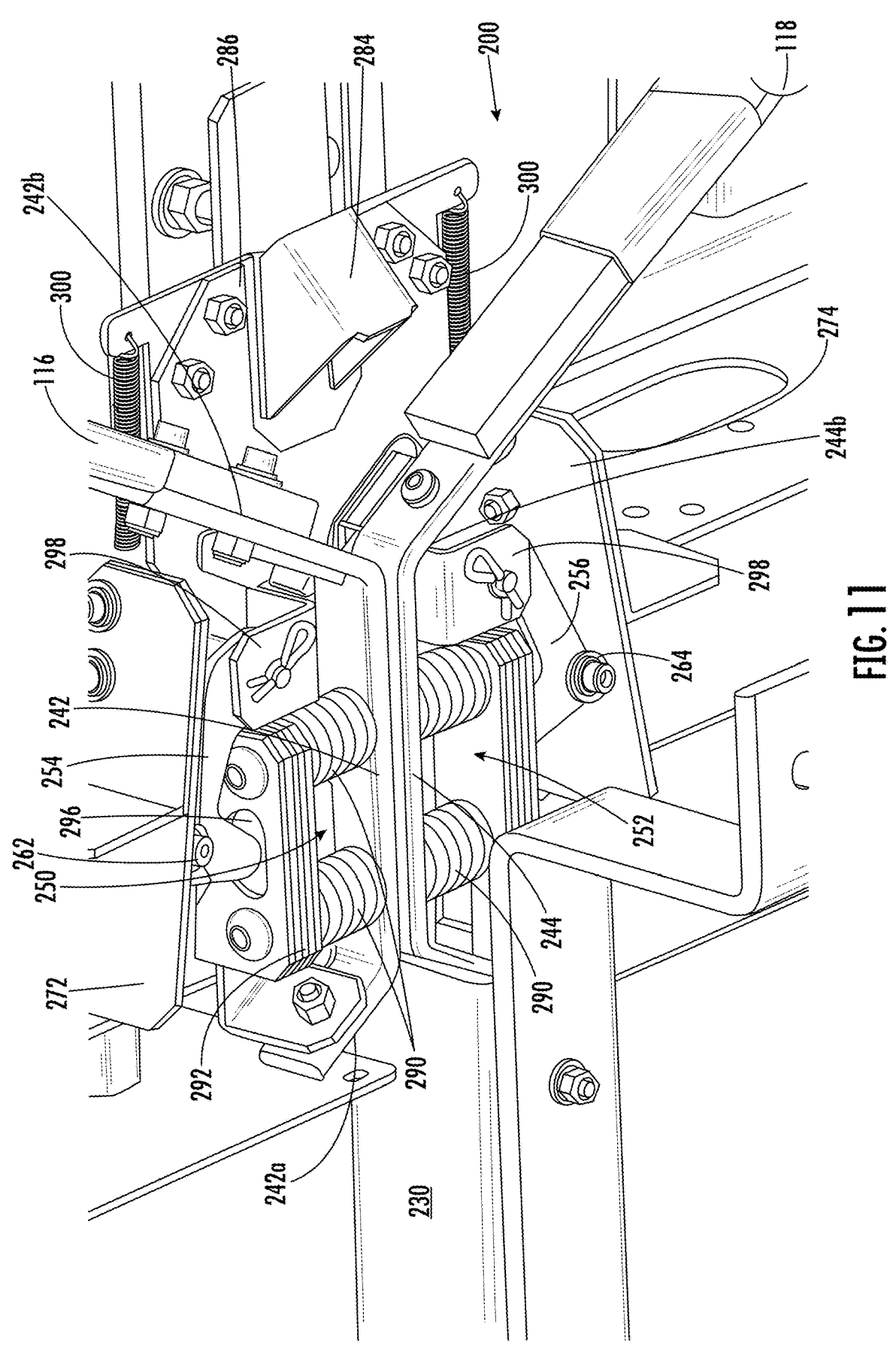
FIG. 11 is an isometric view of the conductive clamp assembly of FIG. 9 showing initial contact to the grounding bar of a grounding circuit.
Figure 12:
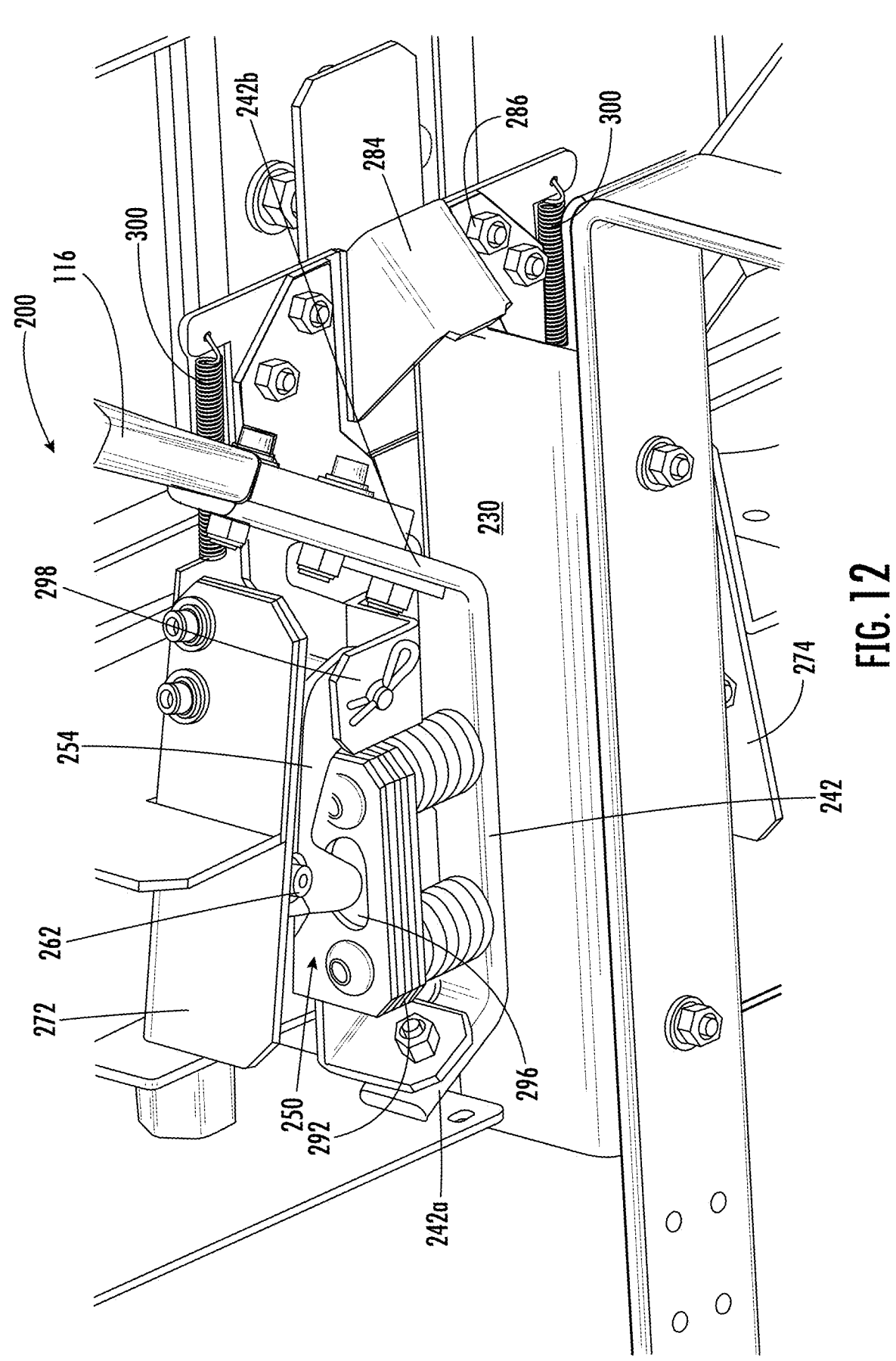
FIG. 12 is an isometric view of the conductive clamp assembly similar to FIG. 11 showing the grounding bar engaging the grounding bar stop.
Figure 13:
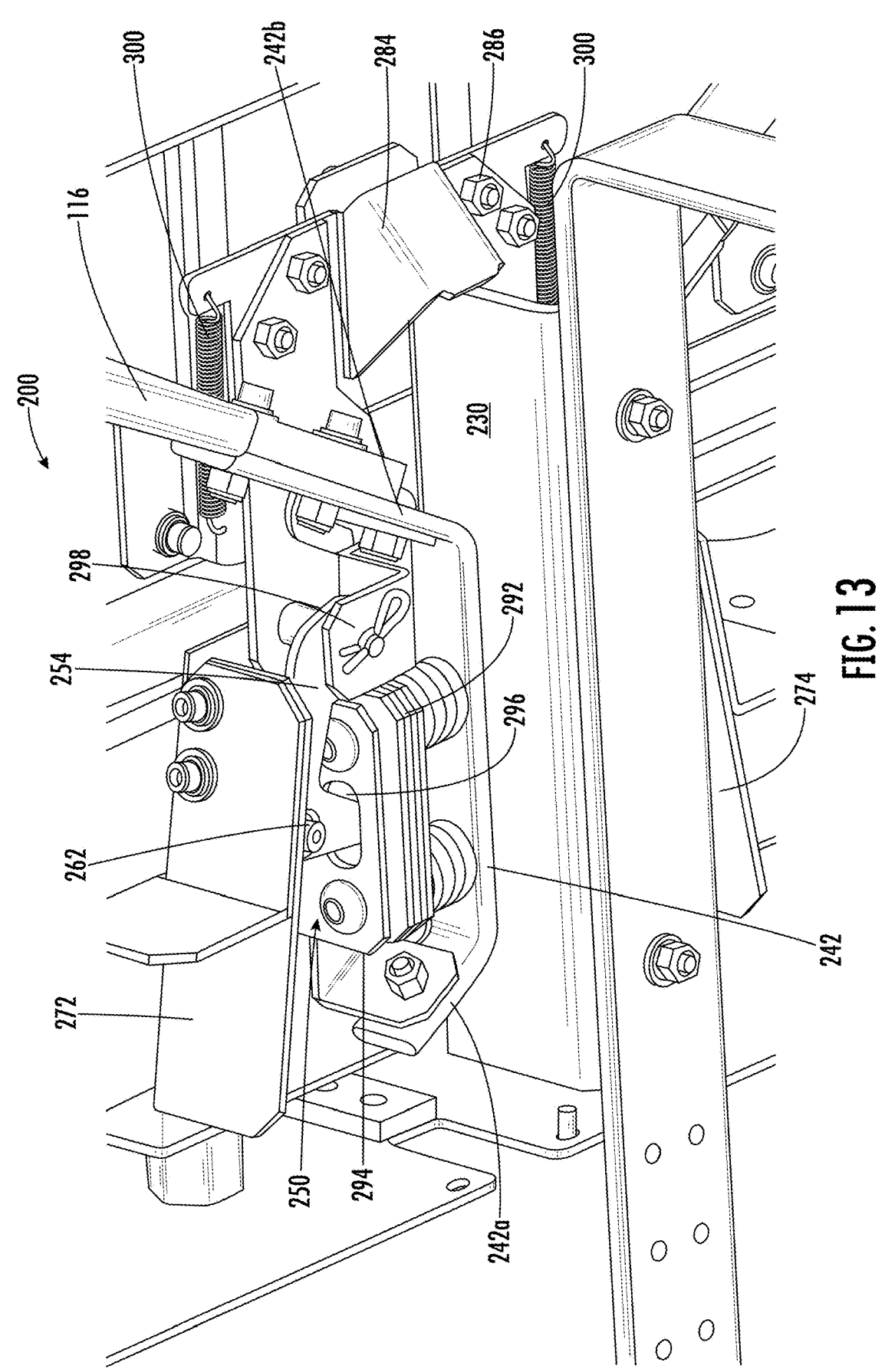
FIG. 13 is an isometric view of the conductive clamp assembly similar to FIG. 12 showing a pivot arm biasing a spring assembly against the electrical contact to clamp onto the grounding bar in secure electrical contact.

Each first and second electrical contact 222, 224 includes a respective spring assembly 250, 252 connected thereto, and each spring assembly includes an associated pivot arm 254,256 engaging the spring assembly and configured to pivot onto the spring assembly and bias the respective spring assembly against the respective electrical contact when the test device housing 38 is in the testing position (FIG. 13). Each pivot arm 254,256 includes a respective roller 242, 264. The ground shoe assembly 70 includes a support plate 270 having opposing inclined surfaces 272,274 extending upward from the outer side edges of the support plate on which the respective pivot arm rollers 262,264 move, and thus, pivot a respective pivot arm 254,256 against the respective spring assembly 250,252 as best shown in FIGS. 11 and 12. A respective roller 262, 264 is moved against the respective inclined surface 272, 274 of the support plate 270, e.g., upward along the support plate 230 with its side inclined surface. As each spring assembly 250,252 and attached pivot arm 254,256 move relative to the support plate 270, each pivot arm pivots against the spring assembly and pushes the spring assembly inward against the first and second opposing contacts as bus bars 242, 244 and clamps down onto the grounding bar 230.

Figure 10:
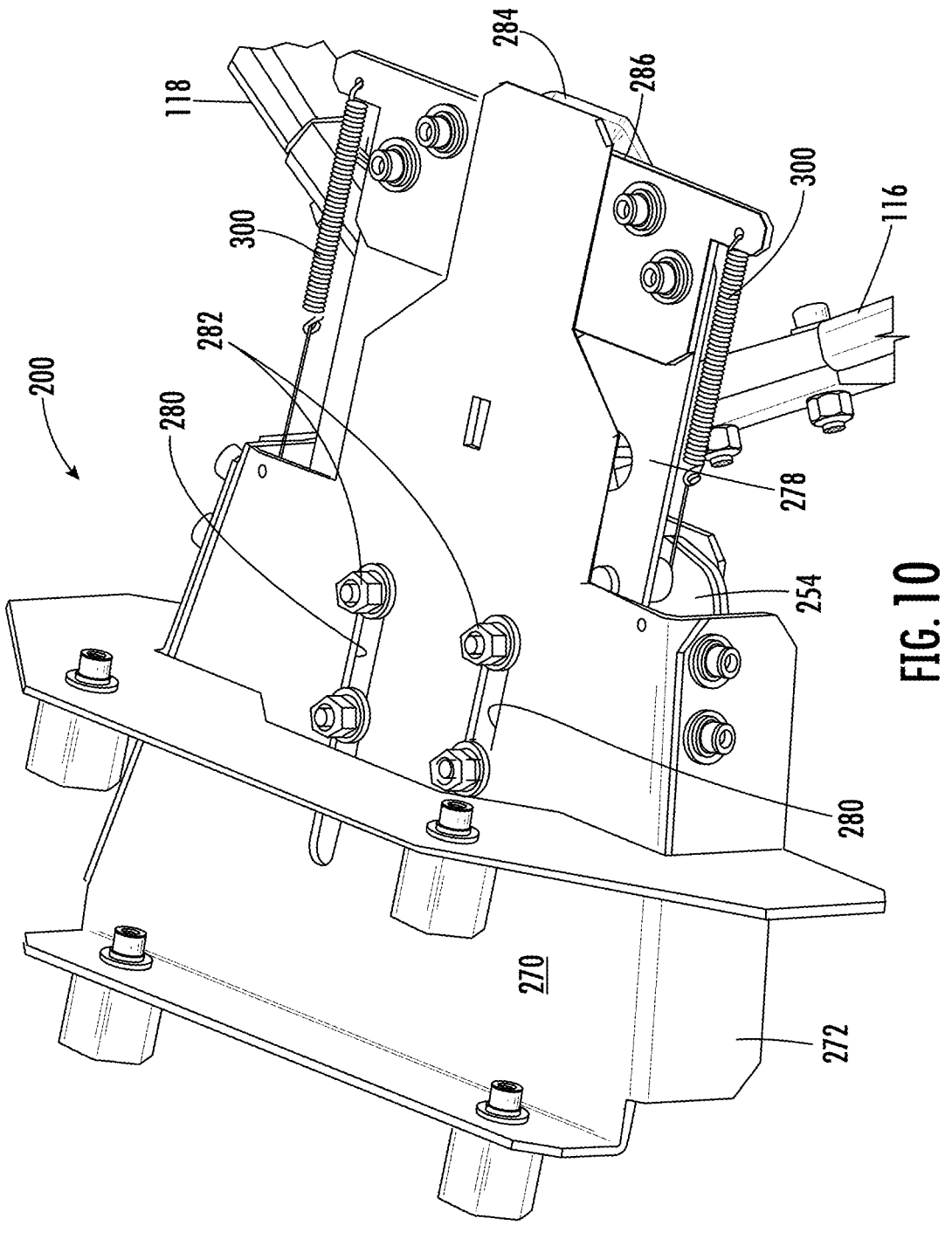
FIG. 10 is an isometric view of the conductive clamp assembly of FIG. 9 looking in the reverse direction.

As shown in FIG. 10, the conductive clamp assembly 200 includes a conductive clamp support 278 that supports the spring assemblies 250,252 and pivot arms 254,256. The support plate 270 includes slots 280 that receive fasteners 282. The fasteners 282 and slots 280 are configured to allow movement of the support plate 270 and the conductive clamp support 278 carrying the spring assemblies 250,252 and pivot arms 254,256 relative to the support plate that includes the opposing inclined surfaces 272, 274.

As shown FIGS. 11-13, the ground shoe assembly 70 includes a grounding bar stop 284 such as mounted on a grounding bar support member 286 that is attached to the conductive clamp support 278 and engages the grounding bar 230 when the test device housing 38 is installed into the testing position. Initial contact between the grounding bar 230 and the conductive clamp assembly 200 is shown in FIG. 11. The testing device housing 38 is further installed and when the grounding bar 230 engages the grounding bar stop 284, each pivot arm 254,256 is biased against the respective inclined surface 272,274 of the respective support plate 270 and pivots onto the respective spring assembly 250,252 to bias the opposing electrical contacts 242,244 against each other for secure electrical contact as shown in FIG. 13, where a pivot arm is shown pivoted against the respective spring assembly.

The conductive clamp support 278 supports the spring assemblies 250,252 and pivot arms 254,256 and forms an assembly similar to a support cage. Each of the opposing contacts formed from bus bars 242,244 includes two springs 290 for each respective spring assembly 250,252 connected between the outer flat side of each opposing bus bar contact and a pair of four plates and spaced fifth plate as the outer plate 294 having an opening 296 (FIGS. 11-12) into which a pivot arm 254,256 pivots and presses against the set of plates 292 that are most adjacent the springs 290 and biases the plates 292 downward to compress the springs 290 connected to a respective contact 242, 244 and bias the electrical contact against the grounding bar 230 (FIG. 13). The pivot arms 254,256 may be supported on a pivot arm support member 298 secured onto the conductive clamp support 278 (FIGS. 11-13). A spring 300 may be connected between a respective pivot arm 254,256 and the conductive clamp support 278 to bias back the respective pivot arms after the test device housing 38 is removed with conductive clamp assembly 200 disengaged from the grounding bar 230.

Referring now to FIGS. 14-19, there are illustrated figures for a second embodiment of the conductive clamp assembly 200' with reference numerals given in prime notation, and any common elements or functions given the same reference numeral as with the embodiment of FIGS. 9-13, but in prime notation. Each pivot arm 254',256' is configured differently and each includes two rollers 262',264' supported by a support forming a roller assembly 263'265' engaging a respective spring assembly 250',252'. The ground shoe assembly 70' includes opposing roller ramps 302' on which each roller assembly 263',265' moves and configured to push each roller assembly against the respective pivot arm 254', 256' and spring assembly 250'252' and bias the spring assembly against the respective electrical contacts 242',244' when the test device housing is in the testing position.

Figure 14:
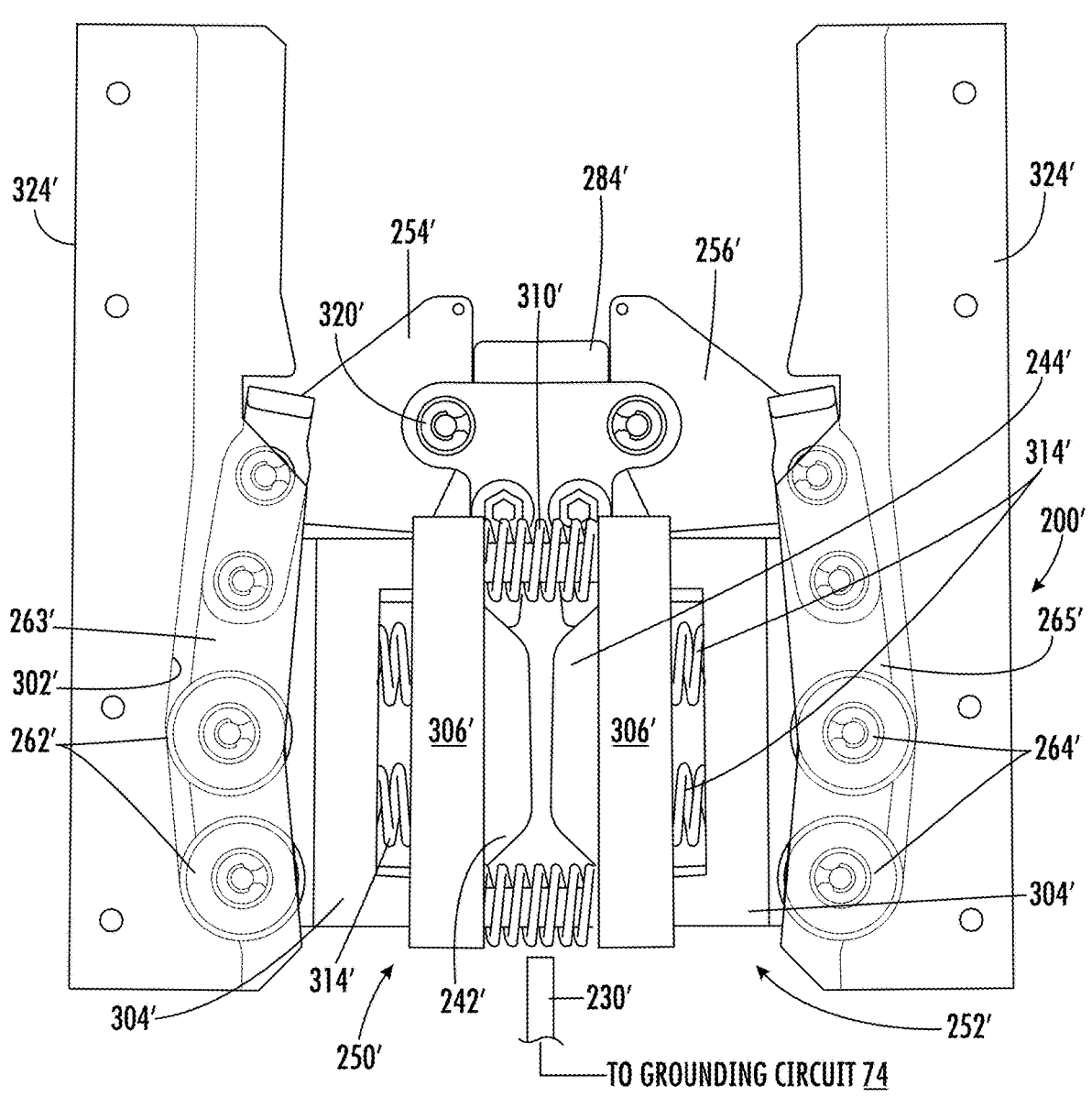
FIG. 14 in a plan view of a second embodiment of the conductive clamp assembly showing a different pivot arm and spring assembly configuration associated with a roller assembly and roller ramp.

As shown in FIG. 14, each spring assembly 250',252' is supported by a machined detent 304' such as formed from fiberglass or other plastic material, but other metallic materials may be used. The detent 304' is functionally a component temporarily keeps one part in a position relative to another and can be released by applying force to one of the parts. The detent 304' has associated therewith opposing contact supports 306' that support the contacts 242',244' with the first spring members 310' interconnecting the two contact supports 306', which in turn, connect to the detent 304' via second spring members 314'. The rollers may be machined rollers for accuracy. Second spring members 314' interconnect the contact supports 306' with the detent 304', which engages the roller assemblies.

Figure 15:
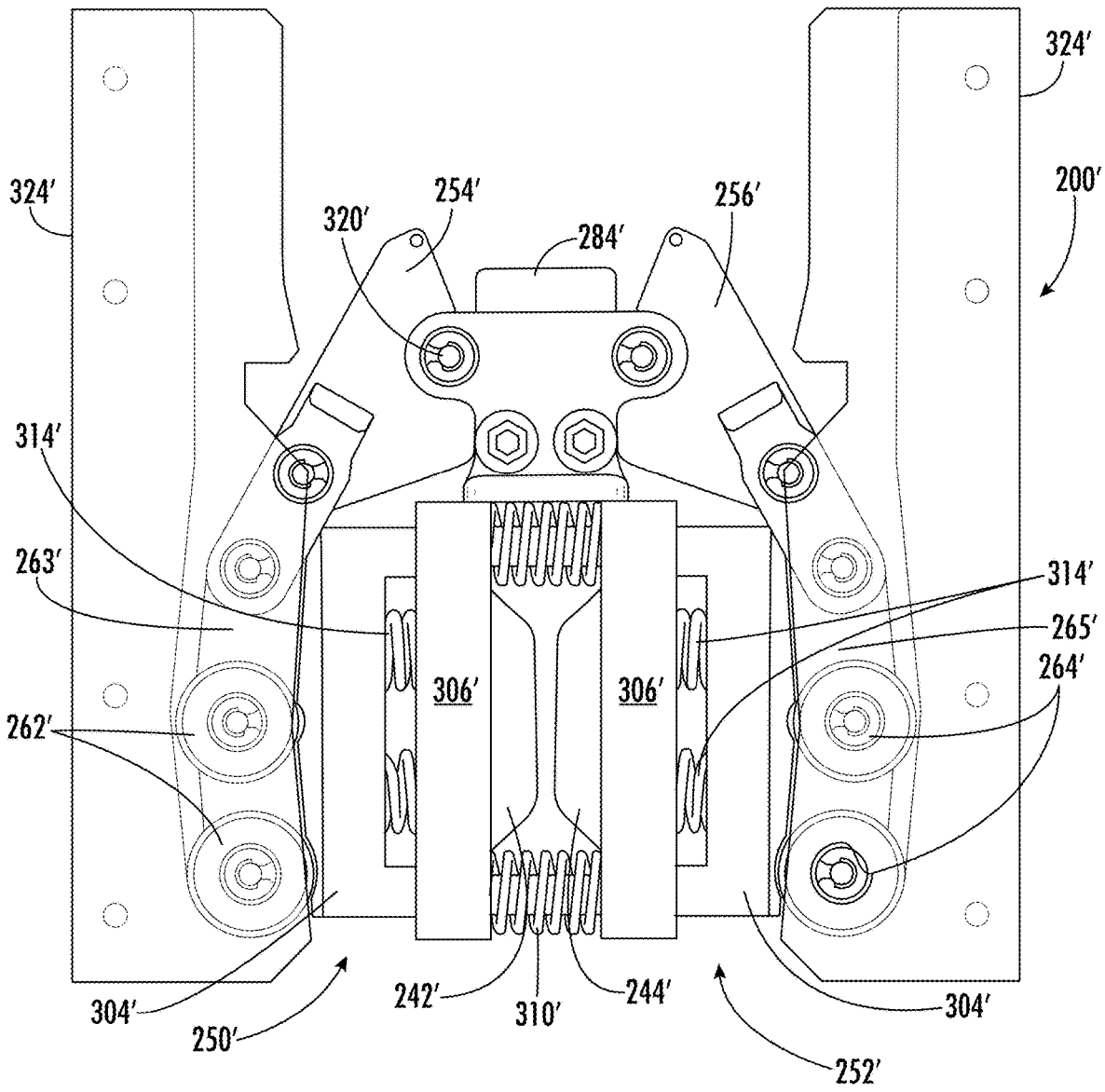
FIG. 15 is another plan view of the conductive clamp assembly of FIG. 14, but showing the pivot arms pivoted to bias the spring assembly against respective electrical contacts.
Figure 16:
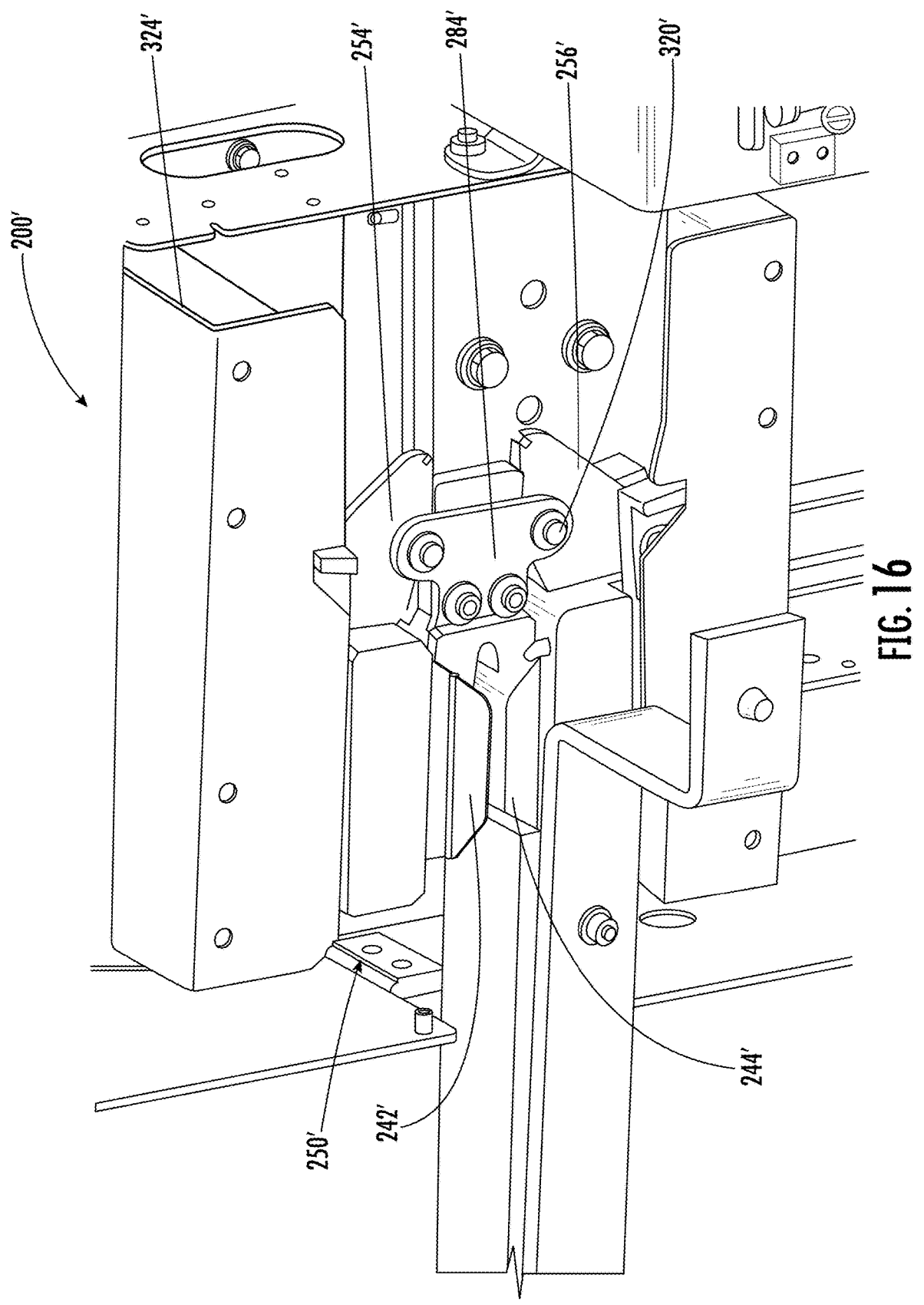
FIG. 16 is an isometric view of the conductive clamp assembly of FIG. 14 showing initial contact with the grounding bar.
Figure 17:
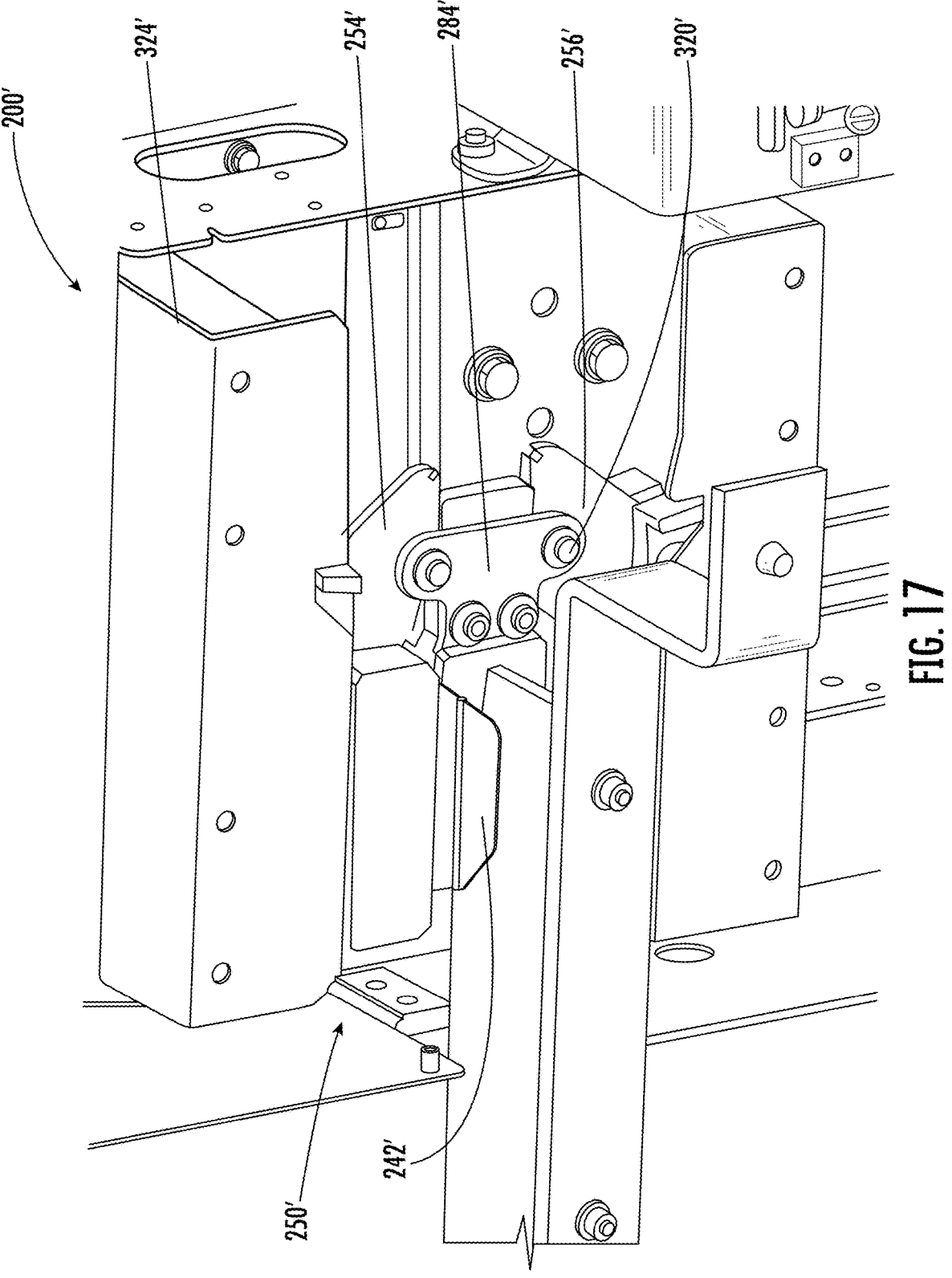
FIG. 17 is another isometric view of the conductive clamp assembly of FIG. 16 showing the grounding bar initially engaging the grounding bar stop.
Figure 18:
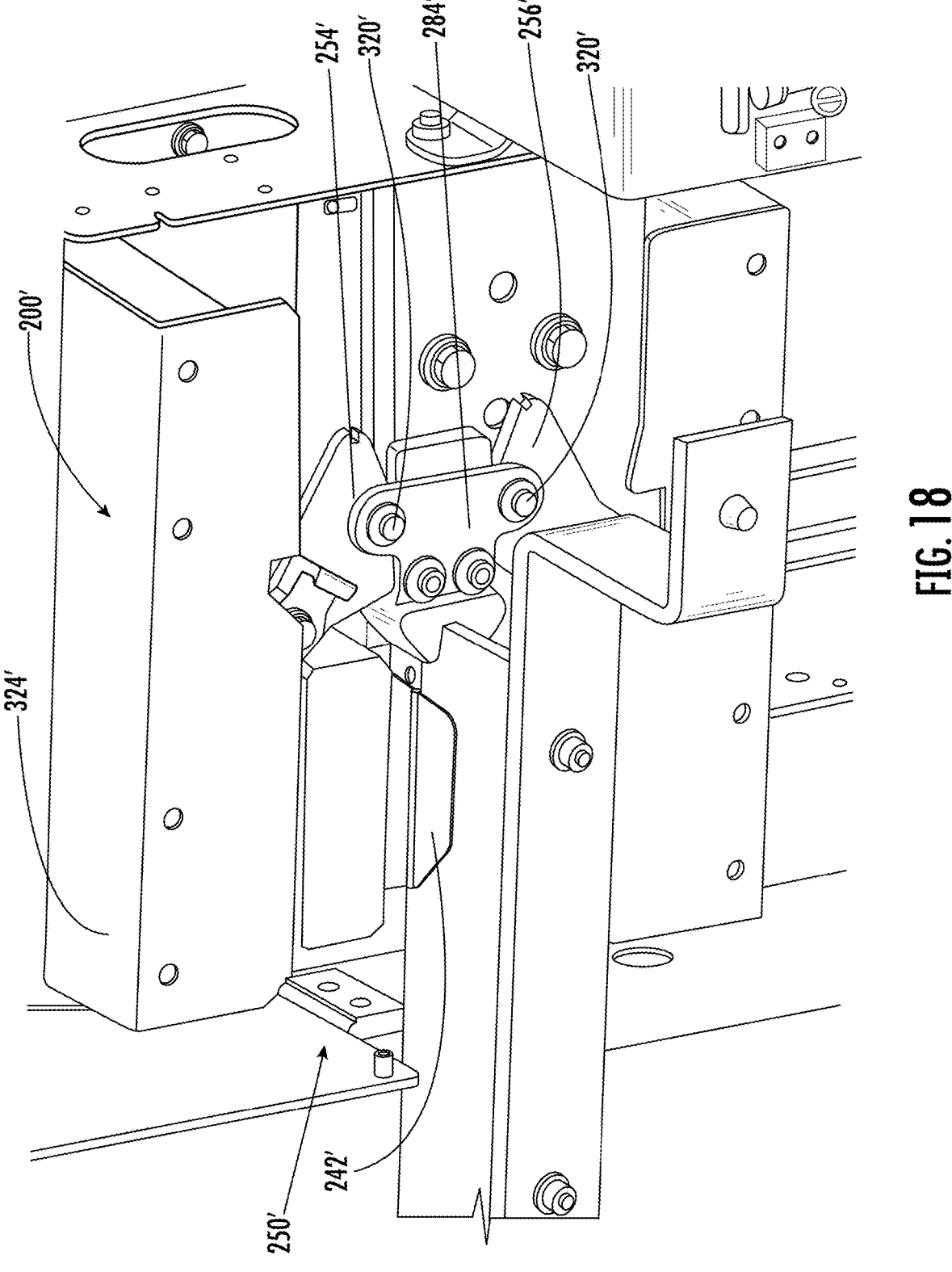
FIG. 18 is another isometric view of the conductive clamp assembly of FIG. 17 showing the pivot arms biasing the spring assemblies against the electrical contacts and into secure electrical contact with the grounding bar.
Figure 19:
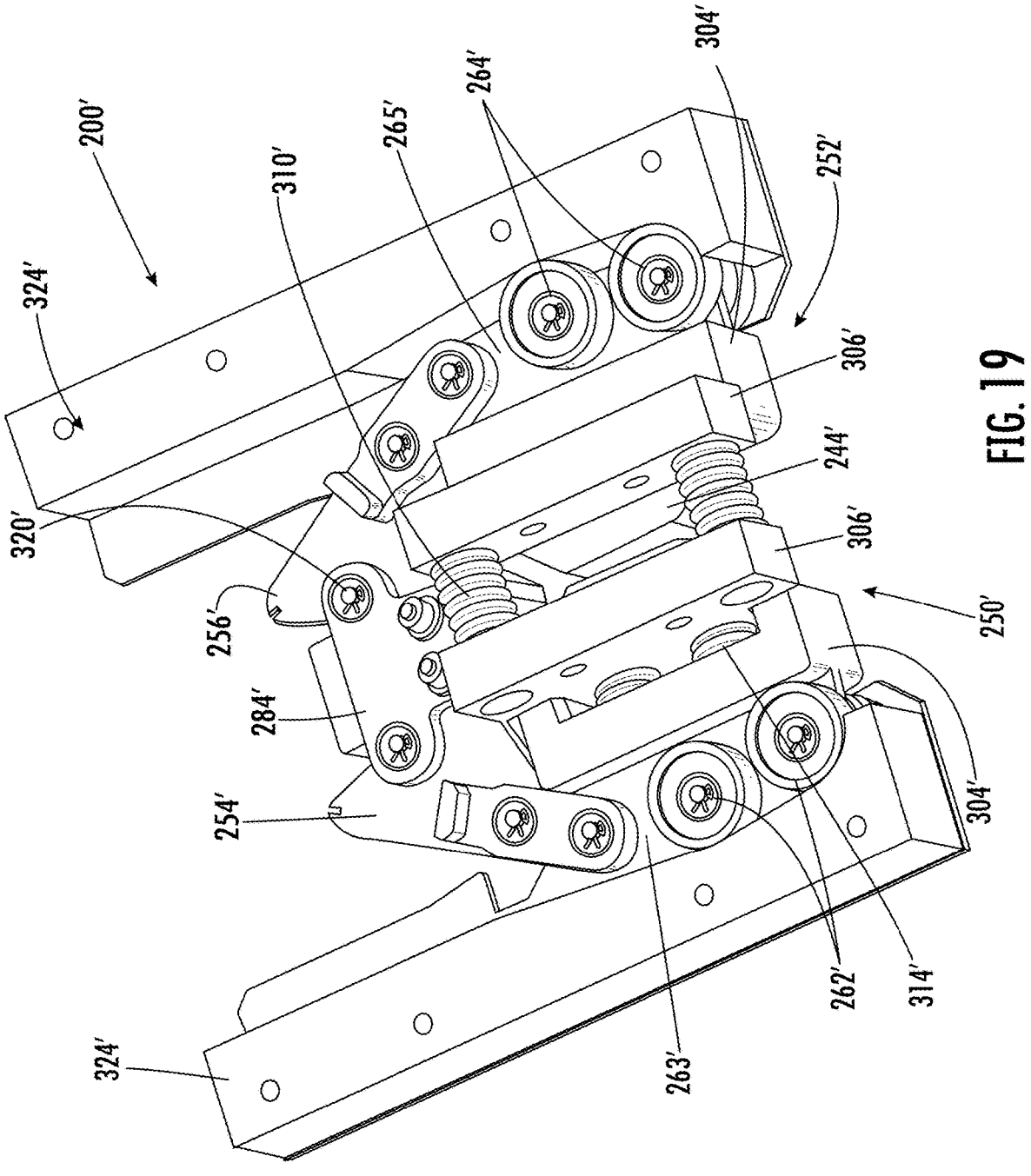
FIG. 19 is another isometric view of the conductive clamp assembly of FIG. 14.

As shown in FIG. 16, the ground bar 230' engages the conductive clamp assembly 200' and is forced against the grounding bar stop 284' shown in FIGS. 16-18. The grounding bar stop 284' is pivotably connected to the pivot arms 254',256' via a pivot pin 320' and when stopped, the grounding bar stop 284' pushes the pivot arms 254',256' up as shown in FIG. 15 and causes the pivot arms to rotate out due the exerted force. The rollers 262',264' may slide against the roller ramp 302', which forms part of a conductive clamp assembly outer support frame 324' (FIG. 14). A tension spring (not shown) may operate to pull the pivot arms 254',256' back down when the grounding bar 230' is released.

It should be understood that this description includes the ground and test device 20, but the conductive clamp assembly 200,200' may be associated with a sliding contact electrical contact assembly having a frame that carries an electrically conductive frame contact corresponding to the grounding bar 230,230' as part of the switchgear housing 38. The conductive clamp assembly 200,200' may be configured to slide on the electrically conductive frame contact 230,230' into a contact position and clamp at that contact position into secure electrical contact with the electrically conductive frame contact. The electrical contact assembly may include opposing electrical contacts associated with the frame and are spaced apart a distance to receive therebetween the electrically conductive frame contact and slide thereon. This sliding electrical contact assembly applies as the conductive clamp assembly 200,200' moves into a contact position. The spring assemblies 250,250',252,252' engage each electrical contacts 242, 242',244,244' and the respective pivot arms 254,254',256,256' are designed to bias the respective spring assemblies against the respective electrical contacts when in the contact position.

Thus, different sliding electrical contact assemblies may be used besides those with a ground and test device, including low voltage and medium voltage applications. In some examples, higher voltage applications may be applicable. Many different copper-to-copper connections may use the electrical contact assembly as described such as for finger contacts and other mechanisms. The electrical contact assembly may be used in cluster assemblies with contact fingers. Thus, the electrical contact assembly that employs the conductive clamp assembly as described may be used with many different types of sliding electrical contacts having the frame, electrically conductive frame contact, and conductive clamp assembly associated with the frame.

A method of operating a ground and test device 20 includes installing a test device housing 38 within a switchgear compartment 24 of a switchgear frame 28 into a testing position. A grounding circuit having a grounding bar 230 carried by the switchgear frame engages the ground shoe assembly carried by the test device housing where the conductive clamp assembly 200 slides on the grounding bar 230 as the test device housing is moved into the testing position. The conductive clamp assembly 200 is configured to clamp onto the grounding bar 230 and secure electrical contact when the test device housing 38 is in the testing position. The conductive clamp assembly 200 may be part of an electrical contact assembly where a frame includes an electrically conductive frame contact similar to the grounding bar and the conductive clamp assembly is mounted on the frame to slide the conductive clamp assembly onto the electrically conductive frame contact into a contact position. The grounding bar stop may be a contact stop of different configurations.

This application is related to copending patent applications entitled, "ELECTRICAL CONTACT ASSEMBLY HAVING CONDUCTIVE CLAMP ASSEMBLY AND ASSOCIATED METHODS," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A ground and test (G&T) device, comprising:

a test device housing configured to be installed within a compartment of a switchgear frame into a testing position; and a ground shoe assembly carried by the test device housing configured to engage a grounding circuit having a grounding bar carried by the switchgear frame, said ground shoe assembly comprising a conductive clamp assembly configured to slide on the grounding bar as the test device housing is moved into the testing position, wherein the conductive clamp assembly is configured to clamp onto the grounding bar in secure electrical contact when the test device housing is in the testing position.

2. The G&T device of claim 1, wherein the conductive clamp assembly comprises opposing electrical contacts spaced apart a distance to receive therebetween the grounding bar and slide thereon as the test device housing moves into the testing position.

3. The G&T device of claim 2, wherein each electrical contact comprises a bus bar.

4. The G&T device of claim 2, wherein each electrical contact includes a spring assembly connected thereto, and a pivot arm engaging the spring assembly and configured to pivot onto the spring assembly to bias the respective spring assembly against the respective electrical contact when the test device housing is in the testing position.

5. The G&T device of claim 4, wherein each pivot arm includes a roller, and said ground shoe assembly comprises a support plate having inclined surfaces on which the respective rollers move to pivot the respective pivot arm against the respective spring assembly.

6. The G&T device of claim 5, wherein said conductive clamp assembly includes fasteners, and said support plate includes slots that receive the fasteners, said fasteners and slots configured to allow movement of the support plate and spring assemblies and pivot arms relative to each other.

7. The G&T device of claim 6, wherein said ground shoe assembly comprises a grounding bar stop configured to engage the grounding bar when the test device housing is installed into the testing position and prevent further movement of the spring assemblies as the roller of each pivot arm is biased against the inclined surface of the respective support plate and pivots onto the respective spring assembly to bias the opposing electrical contacts against each other for secure electrical contact.

8. The G&T device of claim 4, wherein each pivot arm includes a roller assembly engaging each respective spring assembly, said ground shoe assembly including a roller ramp on which each roller assembly moves and configured to push each roller assembly against the respective pivot arm and spring assembly and bias the spring assembly against the respective electrical contacts when the test device housing is in the testing position.

9. The G&T device of claim 1, wherein said ground shoe assembly comprises a grounding bar stop configured to engage the grounding bar when the test device housing is installed into the testing position.

10. A ground and test (G&T) device, comprising:

a test device housing configured to be installed within a compartment of a switchgear frame into a testing position;

a ground shoe assembly carried by the test device housing configured to engage a grounding circuit having a grounding bar carried by the switchgear frame, said ground shoe assembly comprising a conductive clamp assembly configured to slide on the grounding bar as the test device housing is moved into the testing position, wherein the conductive clamp assembly is configured to clamp onto the grounding bar in secure electrical contact when the test device housing is in the testing position;

a plurality of upper terminals and plurality of lower terminals carried by the test device housing, said upper and lower terminals configured to connect to load and line conductors of the switchgear frame when in the testing position;

a lower ground bus bar carried by the test device housing, said ground shoe assembly connected to the lower ground bus bar; and a plurality of grounding bars that selectively connect either the upper terminals to the lower ground bus bar or connect the lower terminals to the lower ground bus bar.

11. The G&T device of claim 10, wherein the conductive clamp assembly comprises opposing electrical contacts spaced apart a distance to receive therebetween the grounding bar and slide thereon as the test device housing moves into the testing position.

12. The G&T device of claim 11, wherein each electrical contact comprises a bus bar.

13. The G&T device of claim 11, wherein each electrical contact includes a spring assembly connected thereto, and a pivot arm engaging the spring assembly and configured to pivot onto the spring assembly to bias the respective spring assembly against the respective electrical contact when the test device housing is in the testing position.

14. The G&T device of claim 13, wherein each pivot arm includes a roller, and said ground shoe assembly comprises a support plate having inclined surfaces on which the respective rollers move to pivot the respective pivot arm against the respective spring assembly.

15. The G&T device of claim 14, wherein said conductive clamp assembly includes fasteners, and said support plate includes slots that receive the fasteners, said fasteners and slots configured to allow movement of the support plate and spring assemblies and pivot arms relative to each other.

16. The G&T device of claim 15, wherein said ground shoe assembly comprises a grounding bar stop configured to engage the grounding bar when the test device housing is installed into the testing position and prevent further movement of the spring assemblies as the roller of each pivot arm is biased against the inclined surface of the respective support plate and pivots onto the respective spring assembly to bias the opposing electrical contacts against each other for secure electrical contact.

17. The G&T device of claim 14, wherein each pivot arm includes a roller assembly engaging each respective spring assembly, said ground shoe assembly including a roller ramp on which each roller assembly moves and configured to push each roller assembly against the respective pivot arm and spring assembly and bias the spring assembly against the respective electrical contacts when the test device housing is in the testing position.

18. The G&T device of claim 10, wherein said ground shoe assembly comprises a grounding bar stop configured to engage the grounding bar when the test device housing is installed into the testing position.

19. The G&T device of claim 10, comprising flexible cables interconnecting the respective electrical contacts and lower ground bus bar.

20. A method of operating a ground and test (G&T) device, comprising:

installing a test device housing within a compartment of a switchgear frame into a testing position; and engaging a grounding circuit having a grounding bar carried by the switchgear frame with a ground shoe assembly carried by the test device housing, said ground shoe assembly comprising a conductive clamp assembly configured to slide on the grounding bar as the test device housing is moved into the testing position, wherein the conductive clamp assembly is configured to clamp onto the grounding bar in secure electrical contact when the test device housing is in the testing position.

21. The method of claim 20, wherein the conductive clamp assembly comprises opposing electrical contacts spaced apart a distance to receive therebetween the grounding bar and slide thereon as the test device housing moves into the testing position.

22. The method of claim 21, wherein each electrical contact comprises a bus bar.

23. The method of claim 21, wherein each electrical contact includes a spring assembly connected thereto, and a pivot arm engaging the spring assembly and configured to pivot onto the spring assembly to bias the respective spring assembly against the respective electrical contact when the test device housing is in the testing position.

24. The method of claim 23, wherein each pivot arm includes a roller, and said ground shoe assembly comprises a support plate having inclined surfaces on which the respective rollers move to pivot the respective pivot arm against the respective spring assembly.

25. The method of claim 24, wherein said conductive clamp assembly includes fasteners, and said support plate includes slots that receive the fasteners, said fasteners and slots configured to allow movement of the support plate and spring assemblies and pivot arms relative to each other.

26. The method of claim 25, wherein said ground shoe assembly comprises a grounding bar stop configured to engage the grounding bar when the test device housing is installed into the testing position and prevent further movement of the spring assemblies as the roller of each pivot arm is biased against the inclined surface of the respective support plate and pivots onto the respective spring assembly to bias the opposing electrical contacts against each other for secure electrical contact.

27. The method of claim 23, wherein each pivot arm includes a roller assembly engaging each respective spring assembly, said ground shoe assembly including a roller ramp on which each roller assembly moves and configured to push each roller assembly against the respective pivot arm and spring assembly and bias the spring assembly against the respective electrical contacts when the test device housing is in the testing position.

28. The method of claim 20, wherein said ground shoe assembly comprises a grounding bar stop configured to engage the grounding bar when the test device housing is installed into the testing position.

* * * * *